(12) United States Patent
Adachi et al.

(10) Patent No.: US 11,882,656 B2
(45) Date of Patent: Jan. 23, 2024

(54) WIRING SUBSTRATE AND METHOD FOR MANUFACTURING WIRING SUBSTRATE

(71) Applicant: IBIDEN CO., LTD., Gifu (JP)

(72) Inventors: Takema Adachi, Ogaki (JP); Daisuke Minoura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 113 days.

(21) Appl. No.: 17/708,486

(22) Filed: Mar. 30, 2022

(65) Prior Publication Data

US 2022/0338347 A1 Oct. 20, 2022

(30) Foreign Application Priority Data

Apr. 15, 2021 (JP) .................. 2021-069307

(51) Int. Cl.
*H05K 1/11* (2006.01)
*H05K 3/38* (2006.01)
*H05K 3/00* (2006.01)
*H05K 3/42* (2006.01)

(52) U.S. Cl.
CPC ............ *H05K 1/113* (2013.01); *H05K 3/383* (2013.01); *H05K 3/389* (2013.01); *H05K 3/0035* (2013.01); *H05K 3/428* (2013.01); *H05K 2201/096* (2013.01); *H05K 2201/09454* (2013.01); *H05K 2201/09827* (2013.01); *H05K 2203/072* (2013.01); *H05K 2203/0723* (2013.01)

(58) Field of Classification Search
CPC .......... H05K 1/11; H05K 1/113; H05K 3/383; H05K 3/389; H05K 3/0035; H05K 3/428

USPC .......................................... 174/262
See application file for complete search history.

(56) References Cited

U.S. PATENT DOCUMENTS 10,716,208 B1 * 7/2020 Momose .............. H05K 3/4682
2016/0316558 A1 * 10/2016 Sakai ...................... H01L 23/12
2018/0270951 A1 * 9/2018 Furutani ................ H05K 3/061

FOREIGN PATENT DOCUMENTS

JP      2018-172759 A     11/2018

* cited by examiner

*Primary Examiner* — Tremesha S Willis
(74) *Attorney, Agent, or Firm* — Oblon, McClelland, Maier & Neustadt, L.L.P.

(57) ABSTRACT

A wiring substrate includes a first conductor layer, an insulating layer formed on the first conductor layer, a second conductor layer formed on the insulating layer, a connection conductor penetrating through the insulating layer and connecting the first and second conductor layers, and a coating film formed on a surface of the first conductor layer and adhering the first conductor layer and the insulating layer. The first conductor layer includes a conductor pad in contact with the connection conductor such that the conductor pad has a surface having a first region and a second region on second conductor layer side and that surface roughness of the first region is different from surface roughness of the second region, and the conductor pad of the first conductor layer is formed such that the first region is covered by the coating film and that the second region is covered by the connection conductor.

20 Claims, 11 Drawing Sheets

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-069307, filed Apr. 15, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2018-172759 describes a printed wiring board in which a chemical conversion coating film is formed on a low-roughened or non-roughened surface of a metal wiring layer and an insulating resin layer is formed on the metal wiring layer via the chemical conversion coating film. The entire contents of this publication are incorporated herein by reference.

SUMMARY OF THE INVENTION

According to one aspect of the present invention, a wiring substrate includes a first conductor layer, an insulating layer formed on the first conductor layer, a second conductor layer formed on the insulating layer, a connection conductor penetrating through the insulating layer such that the connection conductor is connecting the first conductor layer and the second conductor layer, and a coating film formed on a surface of the first conductor layer such that the coating film is adhering the first conductor layer and the insulating layer. The first conductor layer includes a conductor pad in contact with the connection conductor such that the conductor pad has a surface having a first region and a second region on a second conductor layer side and that a surface roughness of the first region is different from a surface roughness of the second region, and the first conductor layer is formed such that the first region of the conductor pad is covered by the coating film and that the second region of the conductor pad is covered by the connection conductor.

According to another aspect of the present invention, a method for manufacturing a wiring substrate includes forming a first conductor layer having a conductor pad on a first insulating layer, roughening an exposed surface of the first conductor layer formed on the first insulating layer, forming a coating film on the first conductor layer such that the coating film covers the first conductor layer, forming a second insulating layer on the first conductor layer and the coating film formed on the first conductor layer, forming a second conductor layer on the second insulating layer, and forming a connection conductor in the second insulating layer such that the connection conductor penetrates through the second insulating layer and connects the conductor pad and the second conductor layer. The roughing of the exposed surface of the first conductor layer includes forming a surface of the conductor pad having a first region and a second region on the opposite side with respect to a first insulating layer side such that a surface roughness of the first region is different from a surface roughness of the second region, the forming of the coating film includes covering the first region with the coating film, and the forming of the connection conductor includes covering the second region with the connection conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
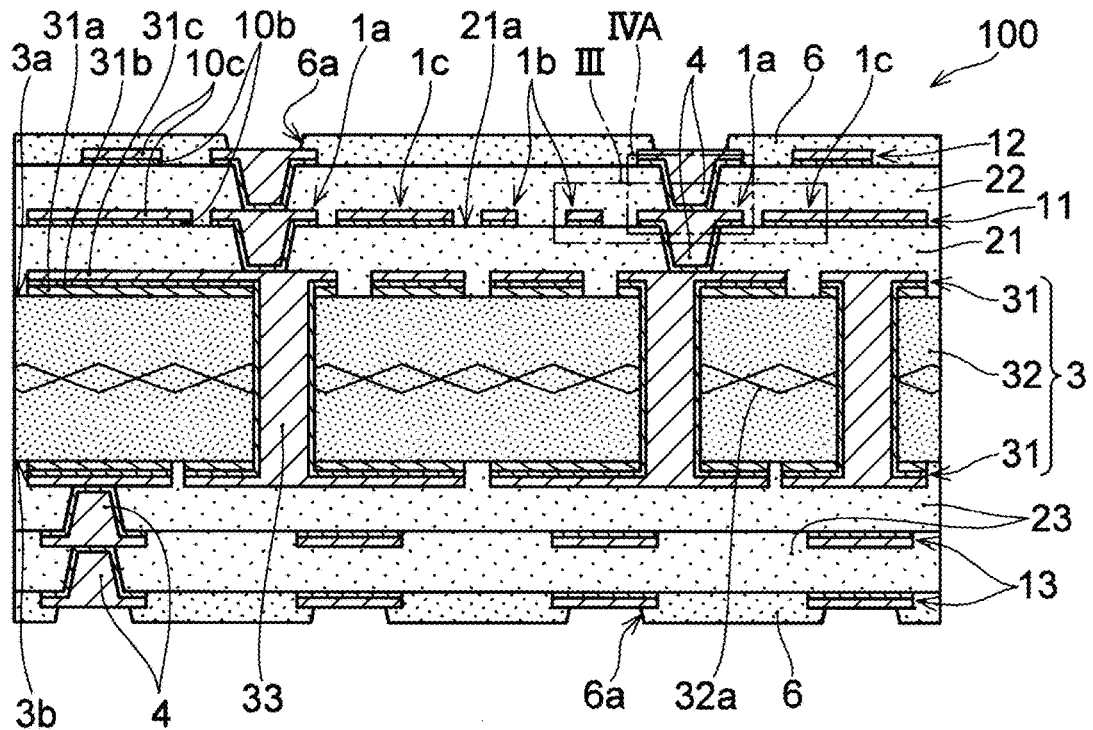
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
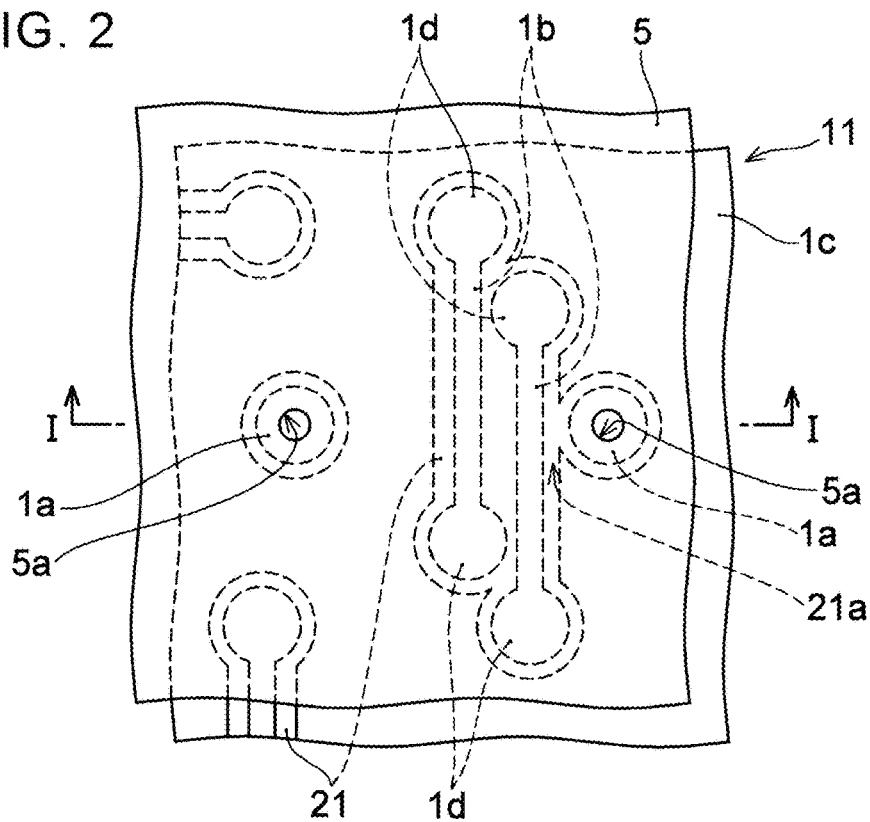
FIG. 2 is a plan view illustrating an example of conductor patterns of a first conductor layer according to an embodiment of the present invention.

A wiring substrate of an embodiment of the present invention is described with reference to the drawings. FIG. 1 is a cross-sectional view illustrating a wiring substrate 100, which is an example of the wiring substrate of the embodiment. FIG. 2 is a plan view illustrating an example of conductor patterns that are a part of a first conductor layer 11 of the wiring substrate 100. FIG. 1 illustrates a cross-sectional view at a cutting line that overlaps an I-I line in FIG. 2. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and insulating layers and conductor layers that are alternately laminated on two main surfaces (a first surface (3a) and a second surface (3b)) of the core substrate 3 opposing each other in a thickness direction of the core substrate 3. The core substrate 3 includes an insulating layer 32, and conductor layers 31 that are respectively formed on both sides of the insulating layer 32.

In the description of the embodiment, a side farther from the insulating layer 32 in a thickness direction of the wiring substrate 100 is also referred to as an "upper side" or simply "upper", and a side closer to the insulating layer 32 is also referred to as a "lower side" or simply "lower". Further, for the conductor layers and the insulating layers, a surface facing the opposite side with respect to the insulating layer 32 is also referred to as an "upper surface", and a surface facing the insulating layer 32 side is also referred to as a "lower surface".

The wiring substrate 100 includes, on the first surface (3a) of the core substrate 3, an insulating layer 21 (first insulating layer), a first conductor layer 11, an insulating layer 22 (second insulating layer), and a second conductor layer 12. The insulating layer 21 covers the first surface (3a) of the core substrate 3. The first conductor layer 11 is formed on a surface (21a) of the insulating layer 21, and the insulating layer 22 is formed on the insulating layer 21 and the first conductor layer 11. Then, the second conductor layer 12 is formed on the insulating layer 22. The wiring substrate 100 further includes two insulating layers 23 and two conductor layers 13 that are alternately laminated on the second surface (3b) of the core substrate 3. The wiring substrate 100 further includes connection conductors 33 and connection conductors 4 that penetrate the insulating layers and connect conductor layers that are adjacent to each other via the insulating layers. The connection conductors 33 are so-called through-hole conductors contained in the insulating layer 32 of the core substrate 3. The connection conductors 4 are so-called via conductors formed in the insulating layers (21-23) that are sequentially built up. For example, the connection conductors 4 formed in the insulating layer 22 connect the first conductor layer 11 and the second conductor layer 12 to each other.

A solder resist 6 is formed on the insulating layer 22 and the second conductor layer 12. A solder resist 6 is also formed on the outermost layer on the second surface (3b) side of the core substrate 3. The solder resists 6 are provided with openings (6a), and each of the openings (6a) exposes a part of the second conductor layer 12 or a part of the conductor layer 13. Each of the solder resists 6 is formed of, for example, a photosensitive epoxy resin or polyimide resin, or the like.

Each of the insulating layers (21-23) and the insulating layer 32 is formed of any insulating resin. Examples of the insulating resin include an epoxy resin, a bismaleimide triazine resin (BT resin), a phenol resin, and the like. In the example of FIG. 1, the insulating layer 32 contains a core material (reinforcing material) (32a) formed of a glass fiber, an aramid fiber, or the like. Although not illustrated in FIG. 1, the insulating layers other than the insulating layers 32 can also each contain a core material formed of a glass fiber or the like. The insulating layers can each further contain inorganic filler (not illustrated in the drawings) formed of fine particles of silica ($SiO_2$), alumina, mullite, or the like.

The first and second conductor layers (11, 12), the conductor layers 13, and the conductor layers 31, and the connection conductors 4 and the connection conductors 33, are each formed using any metal such as copper or nickel. In the example of FIG. 1, the conductor layers 31 each include a metal foil (31a), a metal film (31b), and a plating film (31c). The connection conductors 33 are integrally formed with the conductor layers 31, and are formed by the metal film (31b) and the plating film (31c). On the other hand, the first and second conductor layers (11, 12) and the conductor layers 13, and the connection conductors 4 are each formed of a metal film (10b) and a plating film (10c). Each of the connection conductors 4 is integrally formed with the conductor layer connected to the each of the connection conductors 4 on an upper side of the each of the connection conductors 4. The plating films (31c, 10c) are, for example, electrolytic plating films. The metal film (31b) and the metal film (10b) are, for example, electroless plating films or sputtering film, and respectively function as power feeding layers when the plating film (31c) and the plating film (10c) are formed by electrolytic plating. The conductor layers each include predetermined conductor patterns. The first conductor layer 11 includes conductor pads (1a). In the example of FIGS. 1 and 2, the first conductor layer 11 further includes wiring patterns (1b) and a conductor pattern (1c).

The conductor pads (1a) are in contact with the connection conductors 4 that penetrate the insulating layer 22. That is, the conductor pads (1a) are conductor pads on which the connection conductors 4 are formed, and are so-called receiving pads for the connection conductors 4 that penetrate the insulating layer 22. In the example of FIG. 1, the connection conductors 4 that penetrate the insulating layer 21 and the connection conductors 4 that penetrate the insulating layer 22 are formed to be stacked, and so-called stack via conductors are formed. The conductor pads (1a) are provided as so-called via pads of the connection conductors 4 (via conductors) that penetrate the insulating layer 21.

The wiring patterns (1b) are conductor patterns that function as conductive paths used for transmission of any electrical signals or supply of electric power. Surfaces of the wiring patterns (1b) other than surfaces facing the insulating layer 21 are covered by the insulating layer 22. The wiring patterns (1b), for example, may independently, or in cooperation with other conductor patterns, connect predetermined transmission source and transmission destination of electrical signals, or may connect predetermined supply source and supply destination of electric power. The wiring patterns (1b) may be, for example, transmission paths for signals of high frequencies exceeding several GHz. As illustrated in FIG. 2, two wiring patterns (1b) in the example of FIG. 1 connect two conductor pads (1d) in the first conductor layer 11.

The conductor pattern (1c) is a conductor pattern having a flat plate-like shape extending over a region where the conductor pads (1a) and the wiring patterns (1b) are not formed. The conductor pattern (1c) may be a so-called solid pattern provided in the first conductor layer 11 so as to substantially fill the region where conductors such as wirings or connection pads other than the conductor pattern (1c) are not formed. The conductor pattern (1c) is used, for example, as a ground potential or a ground plane or a power plane to which a specific power supply potential is applied.

Although omitted in FIG. 1, as illustrated in FIG. 2, the wiring substrate 100 further includes a coating film 5 that is formed on a surface of the first conductor layer 11 on the opposite side with respect to the insulating layer 21 and on the surface (21a) of the insulating layer 21. That is, the surface of the first conductor layer 11 on the second conductor layer 12 side and the surface (21a) of the insulating layer 21 are covered by the coating film 5. Among the conductor patterns of the first conductor layer 11, the wiring patterns (1b) are completely covered by the coating film 5. In the example of FIG. 2, the conductor pattern (1c) is also substantially completely covered by the coating film 5. On the other hand, the conductor pads (1a) are partially covered by the coating film 5. The coating film 5 has openings (5a) on the conductor pads (1a) and covers the conductor pads (1a) with portions around the openings (5a).

Figure 3:
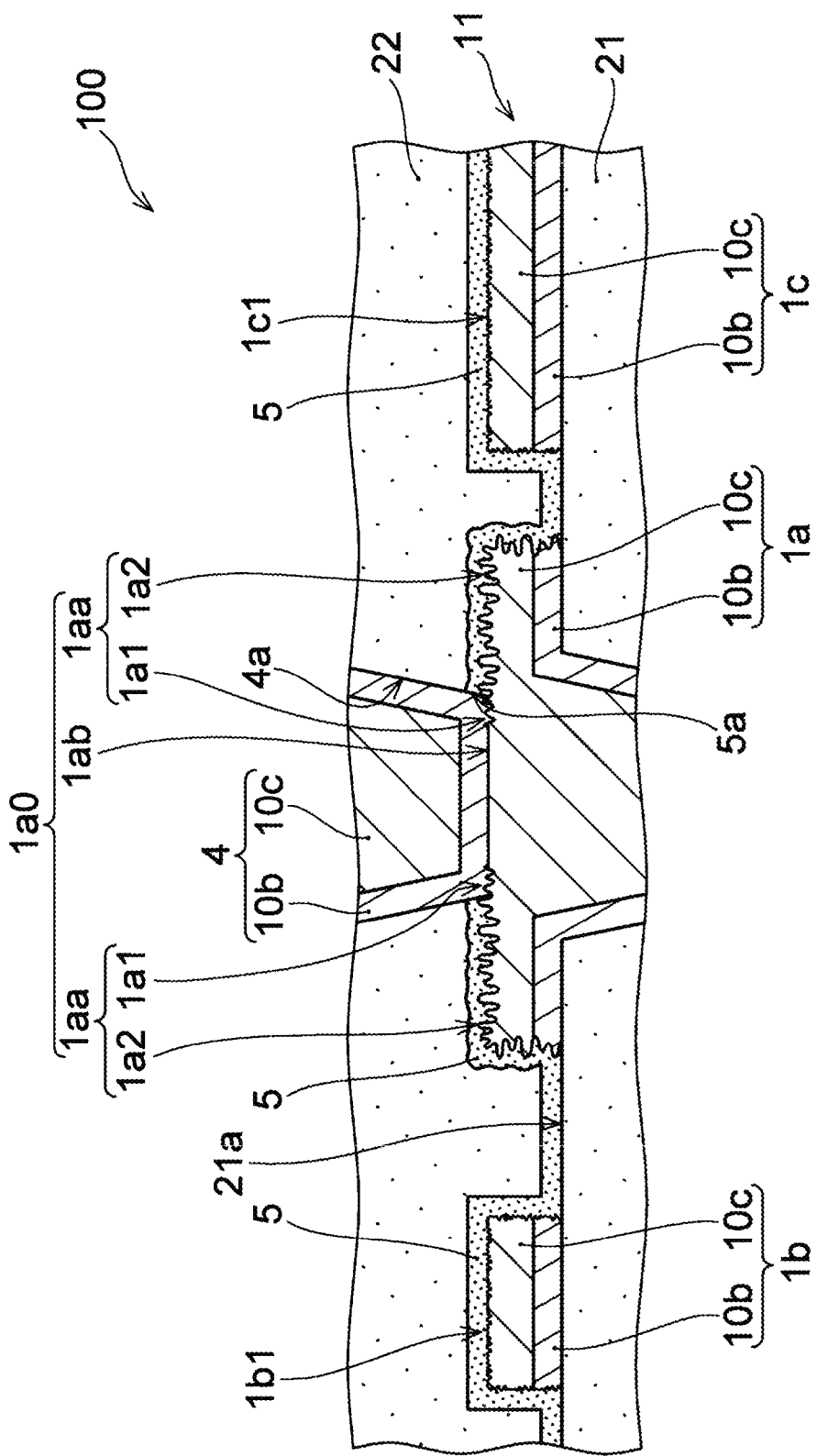
FIG. 3 is an enlarged view of a portion (III) of FIG. 1.
Figure 4A:
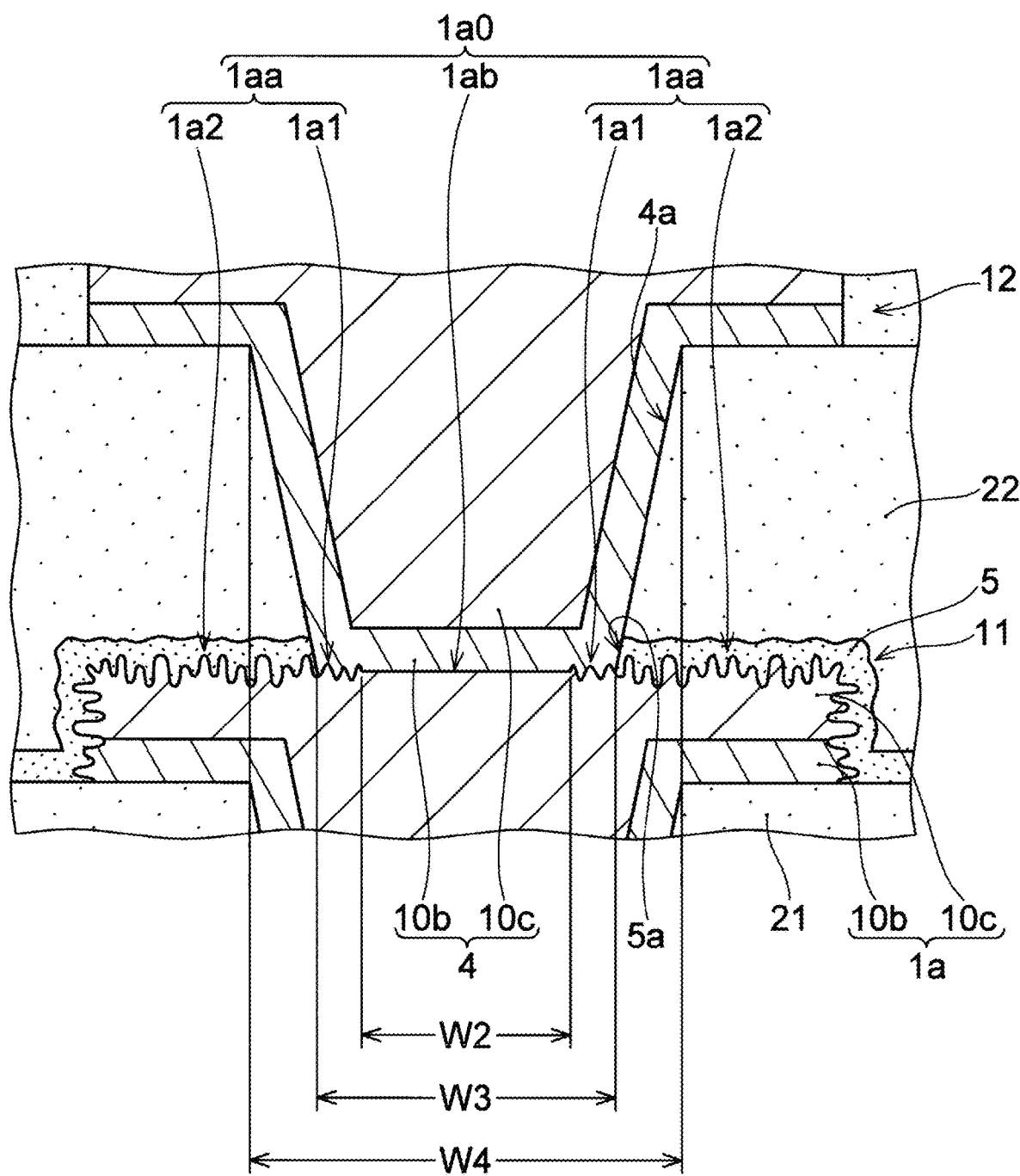
FIG. 4A is an enlarged view of a portion (IVA) of FIG. 1.
Figure 4B:
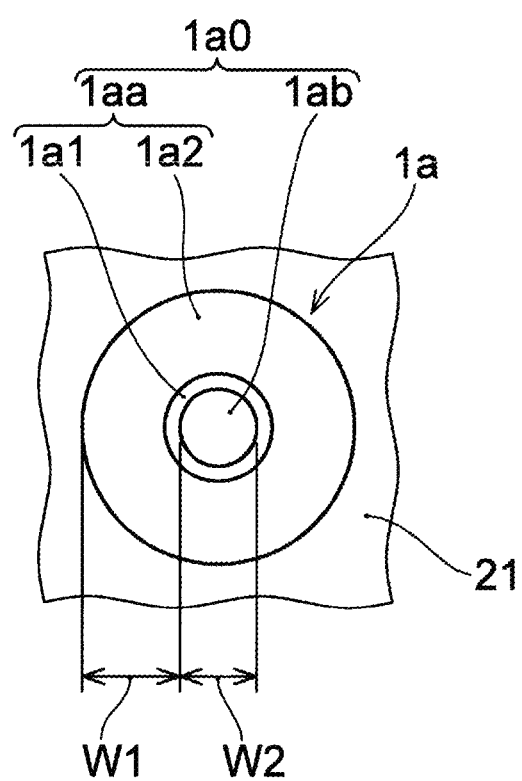
FIG. 4B is a plan view of a conductor pad of FIG. 4A.

FIG. 3 illustrates an enlarged view of a portion (III) of FIG. 1. FIG. 4A illustrates an enlarged view of a portion (IVA) of FIG. 1 including a part of FIG. 3, and FIG. 4B illustrates a plan view of the conductor pad (1a) illustrated in FIG. 4A. With reference to FIGS. 3, 4A and 4B, surface roughness of surfaces (1a0), which are surfaces of the conductor pads (1a) on the second conductor layer 12 side, is described in detail together with the coating film 5.

As illustrated in FIG. 3, the coating film 5 is formed on the surface of the first conductor layer 11 and on the surface (21a) of the insulating layer 21, and is interposed between the first conductor layer 11 or the insulating layer 21 and the insulating layer 22.

The coating film 5 improves adhesion between the first conductor layer 11 and the insulating layer 22. The coating film 5 is formed of, for example, a material that can bind to both an organic material such as a resin forming the insulating layer 22 and an inorganic material such as a metal forming the first conductor layer 11. The coating film 5 is formed of, for example, a material that contains both a reactive group capable of chemically bonding to an organic material and a reactive group capable of chemically bonding to an inorganic material. Therefore, the conductor patterns of the first conductor layer 11, which are covered by the coating film 5, and the insulating layer 22 adhere to each other with sufficient strength. An example of a material of the coating film 5 is a silane coupling agent containing an azole silane compound such as a triazole compound. The material of the coating film 5 is not limited to a silane coupling agent as long as the material can increase the adhesion strength between the first conductor layer 11 and the insulating layer 22 as compared to the case where the insulating layer 22 is directly formed on the first conductor layer 11.

As illustrated in FIG. 3, in the present embodiment, of surfaces of the wiring patterns (1b), surfaces (1b1) facing the insulating layer 22 (hereinafter, also simply referred to as the "surfaces (1b1)") are covered by the coating film 5. In the example of FIG. 3, of surfaces of the conductor pattern (1c), a surface (1c1) facing the insulating layer 22 (hereinafter, also simply referred to as the "surface (1c1)") is also covered by the coating film 5. Therefore, adhesion between the insulating layer 22 and each of the wiring patterns (1b) and the conductor pattern (1c) is increased as compared to the case where the coating film 5 is absent. Therefore, it is thought that floating or peeling off of the insulating layer 22 from the wiring patterns (1b) or the conductor pattern (1c) is unlikely to occur.

The coating film 5 partially covers the conductor pads (1a). Specifically, of surfaces of the conductor pads (1a), regions facing the insulating layer 22 are covered by the coating film 5. Since the coating film 5 is interposed between the conductor pads (1a) and the insulating layer 22, it is thought that, also on the conductor pads (1a), floating or peeling off of the insulating layer 22 is unlikely to occur.

On the other hand, inner portions (center portions) of the surfaces (1a0) of the conductor pads (1a) are exposed in the openings (5a) of the coating film 5 without being covered by the coating film 5. Portions of the surfaces (1a0) in the openings (5a) are covered by the connection conductors 4. That is, the connection conductors 4 are connected to the conductor pads (1a) in the portions of the surfaces (1a0) of the conductor pads (1a) that are not covered by the coating film 5. Therefore, for example, without intervention of an organic material such as a silane coupling agent that forms the coating film 5, a metal such as copper that forms the conductor pads (1a) and a metal such as copper that forms the connection conductors 4 are in direct contact with each other.

Therefore, it is thought that, at interfaces between the conductor pads (1a) and the connection conductors 4, a mechanically strong metal-to-metal bond with a low electrical resistance is obtained.

Although omitted in FIG. 1 referenced above, as illustrated in FIG. 3, of the surfaces of the conductor pads (1a), the wiring patterns (1b), and the conductor pattern (1c), the surfaces facing the insulating layer 22 can have an unevenness. A height difference of the unevenness on the surfaces (1b1) of the wiring patterns (1b) is smaller than a height difference of the unevenness of portions of the surfaces (1a0) of the conductor pads (1a) (for example, the portions covered by the coating film 5), and the surfaces (1b1) have a relatively low surface roughness (first surface roughness).

For wiring patterns having highly roughened surfaces, in transmission of high frequency signals, transmission characteristics may deteriorate due to a substantial increase in impedance due to influence of a skin effect. Further, for example, for fine wiring patterns of about (10 µm)/(10 µm) ((wiring width)/(wiring interval)) or less, when their surfaces are highly roughened, it may be possible that desired dimensions cannot be obtained after roughening with respect to designed wiring widths or thicknesses. In contrast, in the present embodiment, since the surfaces (1b1) of the wiring patterns (1b) have a relatively low surface roughness, at least a lower surface roughness than the portions of the surfaces (1a0) of the conductor pads (1a), it is thought that a problem such as deterioration in high frequency transmission characteristics due to a high surface roughness is unlikely to occur.

On the other hand, since a so-called anchor effect obtained between a conductor layer having a surface with a relatively low surface roughness and an insulating layer formed on the surface of the conductor layer is relatively small, peeling between the conductor layer and the insulating layer is likely to occur. However, since the surfaces (1b1) of the wiring patterns (1b) of the present embodiment are covered by the coating film 5, it is thought that peeling between the wiring patterns (1b) and the insulating layer 22 is unlikely to occur. In the example of FIG. 3, the surface (1c1) of the conductor pattern (1c) has an unevenness of a height difference that is about the same as the height difference of the unevenness on the surfaces (1b1) of the wiring patterns (1b), and has substantially the same surface roughness as the surface roughness of the surfaces (1b1). It is thought that good high frequency transmission characteristics can also be obtained in the conductor pattern (1c).

As illustrated in FIGS. 3 and 4A, the height difference of the unevenness in a region on an outer side of the center portion of each of the surfaces (1a0) of the conductor pads (1a) is larger than the height difference of the unevenness of the surfaces (1b1) of the wiring patterns (1b). That is, the surfaces (1a0) of the conductor pads (1a) each have a region (first region (1aa)) that has a surface roughness higher than the first surface roughness of the surfaces (1b1) of the wiring patterns (1b), and the first surface roughness is lower than the surface roughness of the first region (1aa). The first region (1aa) is roughened to have a higher surface roughness than the first surface roughness. The first region (1aa) is roughened by, for example, microetching or the like.

In the example of FIGS. 3 and 4A, the first region (1aa) is partially covered by the coating film 5. As illustrated in FIG. 4A, the first region (1aa) includes a first portion (1a1) that is exposed from the coating film 5 in an opening (5a), and a second portion (1a2) that is covered by the coating film 5. The first portion (1a1) is covered by a connection conductor 4 without being covered by the insulating layer 22. On the other hand, the second portion (1a2) covered by the coating film 5 is also covered by the insulating layer 22 via the coating film 5. In the example of FIG. 4A, the first portion (1a1) and the second portion (1a2) have mutually different surface roughnesses. The second portion (1a2) has a higher surface roughness (second surface roughness) than the surface roughness of the first portion (1a1). Recesses of the unevenness on the second portion (1a2) are filled with the coating film 5.

The surfaces (1a0) of the conductor pads (1a) further each include, on an inner side of the first region (1aa), a region that has an unevenness of a height difference lower than the height difference of the unevenness of the surfaces (1b1) of the wiring patterns (1b). That is, the surfaces (1a0) each have, in addition to the first region (1aa), a region (second region (1ab)) having a surface roughness that is substantially the same as or lower than the first surface roughness of the surfaces (1b1) of the wiring patterns (1b). In this way, in the present embodiment, the surfaces (1a0) of the conductor pads (1a) each have the first region (1aa) and the second region (1ab) that have mutually different surface roughnesses. The first region (1aa) has a relatively high surface roughness, and the second region (1ab) has a relatively low surface roughness. The surface roughness of the second region (1ab) is lower than the surface roughness of the first region (1aa). The second regions (1ab) and the surfaces (1b1) of the wiring patterns (1b) (and the surface (1c1) of the conductor pattern (1c)) do not have to be roughened in a process that is actively provided for roughening these surfaces. The unevenness of the second regions (1ab) and the surfaces (1b1) (and the surface (1c1)) may be generated by grain boundaries of the plating film (10c) or unevenness of a surface of a plating resist during the formation of the plating film (10c).

In the example of FIGS. 3 and 4A, the second region (1ab) of each of the conductor pads (1a) includes a portion (third portion) having a surface roughness lower than the first surface roughness of the surfaces (1b1) of the wiring patterns (1b). Specifically, the entire second region (1ab) has a lower surface roughness than the first surface roughness. In FIGS. 3 and 4A, the second region (1ab) is drawn flat to show a difference in surface roughness from the surfaces (1b1) of the wiring patterns (1b). However, the second region (1ab) does not have to be a flat surface and may have an unevenness corresponding to any surface roughness equal to or lower than the first surface roughness. Further, in the wiring substrate 100 of the present embodiment, the entire second region (1ab) may have substantially the same surface roughness as the surface roughness (first surface roughness) of the surfaces (1b1) of the wiring patterns (1b), or the second region (1ab) may include a portion (fourth portion) having substantially the same surface roughness as the first surface roughness.

In the example of FIGS. 3 and 4A, of the surfaces (1a0) of the conductor pads (1a), portions other than the second portions (1a2) are positioned in the openings (5a). Therefore, of the surfaces (1a0) of the conductor pads (1a), the entire second regions (1ab), and the entire first portions (1a1) of the first regions (1aa), are exposed in the openings (5a) of the coating film 5. The connection conductors 4 are respectively formed over the entire openings (5a), and thus, respectively cover the entire second regions (1ab) of the conductor pads (1a) and the entire first portions (1a1) of the first regions (1aa). Recesses of the unevenness on the first portions (1a1) and, recesses of the unevenness (not illustrated in the drawings) on the second regions (1ab) are filled with the metal film (10b) that forms the connection conductors 4.

As illustrated in FIGS. 4A and 4B, in the surface (1a0) of each of the conductor pads (1a), the second region (1ab) is surrounded by the first region (1aa). The first region (1aa) is positioned on an edge side of the surface (1a0) with respect to the second region (1ab), and surrounds the second region (1ab) in all directions in a plan view. The first region (1aa) has a width (W1) larger than zero. That is, in the surface (1a0) of each of the conductor pads (1a), the first region (1aa) is interposed between the second region (1ab) and an outer edge of the each of the conductor pads (1a). The term "plan view" means viewing the wiring substrate 100 along its thickness direction.

The first portion (1a1) of the first region (1aa) of each of the conductor pads (1a) is positioned on an inner side of the second portion (1a2) and is adjacent to the second region (1ab). On the other hand, the second portion (1a2) surrounds the connection conductor 4 and the first portion (1a1) in a plan view. The second portion (1a2) surrounds the first portion (1a1) in all directions in a plan view. That is, in the surface (1a0) of each of the conductor pads (1a), the second portion (1a2) having a higher surface roughness (second surface roughness) than the surface roughness of the first portion (1a1) is interposed between the first portion (1a1) and the outer edge of the each of the conductor pads (1a). Similarly, in the surface (1a0) of each of the conductor pads (1a), between a connection conductor 4 and the outer edge of the each of the conductor pads (1a), the first region (1aa) having a relatively high surface roughness is interposed, and in particular, the second portion (1a2) having the second surface roughness higher than the surface roughness of the first portion (1a1) is interposed.

In the wiring substrate 100 of the embodiment, the first region (1aa) of the surface (1a0) of each of the conductor pads (1a) is roughened to have a relatively high surface roughness. The first region (1aa) surrounds a connection conductor 4 in a plan view.

Therefore, it is thought that peeling is suppressed between the conductor pads (1a), which are also called "haloing", and the insulating layer 22. Specifically, unintended infiltration of a liquid into interfaces between the conductor pads (1a) and the insulating layer 22 is prevented by the unevenness of the first regions (1aa) having a relatively high surface roughness. As a result, it may be possible that peeling between the conductor pads (1*a*) and the insulating layer 22 that can be caused by such infiltration of a liquid is suppressed.

More specifically, in a manufacturing process of the wiring substrate 100, inner walls of through holes (4*a*) provided in the insulating layer 22 for forming the connection conductors 4 may be exposed to various treatment solutions, plating solutions, or the like. Then, these liquids may infiltrate into the interfaces between the conductor pads (1*a*) and the insulating layer 22 from the inner walls of the through holes (4*a*) and cause peeling between the conductor pads (1*a*) and the insulating layer 22. However, in the present embodiment, the surfaces (1*a*0) of the conductor pads (1*a*) have the first regions (1*aa*) (in the example of FIGS. 3 and 4A, the second portions (1*a*2) of the first regions (1*aa*)) between the through holes (4*a*) and the outer edges of the conductor pads (1*a*). Therefore, unintended infiltration of a liquid that can cause peeling between the conductor pads (1*a*) and the insulating layer 22 is prevented by the unevenness of the first regions (1*aa*) of the conductor pads (1*a*), the first regions (1*aa*) having a relatively high surface roughness. In the example of FIG. 3 and the like, such infiltration of a liquid is prevented by the unevenness of the second portions (1*a*2) of the first regions (1*aa*), the second portions (1*a*2) having the second surface roughness.

Further, in the present embodiment, it is thought that deterioration in quality due to dissolution of the coating film 5 covering the first conductor layer 11 is unlikely to occur. As described above, in a manufacturing process of the wiring substrate 100, the inner walls of the through holes (4*a*) provided in the insulating layer 22 can be exposed to various liquids. When a liquid infiltrates into the interfaces between the conductor pads (1*a*) and the insulating layer 22, the infiltrated liquid may dissolve the coating film 5. In this case, it is possible that the coating film 5 elutes into the through holes (4*a*), causing a connection failure between the connection conductors 4 and the conductor pads (1*a*) or causing peeling between the first conductor layer 11 and the insulating layer 22 at a dissolution site of the coating film 5. However, in the present embodiment, such unintentional infiltration of a liquid that could result in such dissolution of the coating film 5 is prevented by the unevenness of the first regions (1*aa*) of the conductor pads (1*a*) having a relatively high surface roughness. Therefore, the coating film 5 is unlikely to dissolve. That is, the first conductor layer 11 and the insulating layer 22 are unlikely to peel off from each other. Further, a connection failure between the connection conductors 4 and the conductor pads (1*a*) due to elution of the coating film 5 into the through holes (4*a*) is also unlikely to occur.

In addition, in the present embodiment, since the surfaces (1*a*0) of the conductor pads (1*a*) each have the second region (1*ab*) having a relatively low surface roughness on inner side of the first region (1*aa*), it is thought that peeling between the insulating layer 22 and the conductor pads (1*a*) is more unlikely to occur. More specifically, the surfaces (1*a*0) of conductor pads (1*a*) have an emissivity according to their surface roughness, and the higher the surface roughness, the higher the emissivity the surfaces (1*a*0) can have. In other words, when the surfaces (1*a*0) of the conductor pads (1*a*) have a higher surface roughness, the surfaces (1*a*0) of the conductor pads (1*a*) can absorb more heat from electromagnetic waves such as laser, and as a result, the temperature of the conductor pads (1*a*) rises.

On the other hand, as will be described later, the through holes (4*a*) for forming the connection conductors 4 can be formed, for example, by irradiating laser. Laser is irradiated to the center portions of the surfaces (1*a*0) of the conductor pads (1*a*), which are the receiving pads of the connection conductors 4. Therefore, when the entire surfaces (1*a*0) of the conductor pads (1*a*) have a relatively high surface roughness such as that of the first regions (1*aa*), the temperature of the conductor pads (1*a*) is likely to rise. As a result, due to a difference in thermal expansion coefficient between the coating film 5 and the insulating layer 22, interfacial peeling may occur between the coating film 5 and the insulating layer 22.

However, in the present embodiment, the surfaces (1*a*0) of the conductor pads (1*a*) each include the second region (1*ab*) having a relatively low surface roughness on an inner side of the first region (1*aa*) having a relatively high second surface roughness. Therefore, even when an electromagnetic wave such as laser is irradiated to the conductor pads (1*a*) for the formation of the through holes (4*a*), as compared to the case where the entire surfaces (1*a*0) have the same surface roughness as the surface roughness of the first region (1*aa*), the temperature of the conductor pads (1*a*) is unlikely to rise. Therefore, it is thought that interfacial peeling between the coating film 5 and the insulating layer 22, that is, peeling between the insulating layer 22 and the conductor pads (1*a*) is more unlikely to occur.

As described above, in the wiring substrate 100, good transmission characteristics and sufficient adhesion to the insulating layer 22 are obtained in the wiring patterns (1*b*). In addition, deterioration in quality due to peeling or the like between the conductor pads (1*a*), which are in contact with the connection conductors 4, and the insulating layer 22 can be suppressed. In this way, according to the present embodiment, it is may be possible that desired characteristics in the wiring patterns and adhesion between the wiring patterns and the insulating layer can be ensured, and in addition, deterioration in quality of the wiring substrate due to peeling or the like between the conductor layer, which is in contact with the connection conductors that connect the conductor layers, and the insulating layer can be suppressed.

In order to achieve both the suppression of a temperature rise in the conductor pads (1*a*) and the prevention of infiltration of a liquid into the interfaces between the conductor pads (1*a*) and the insulating layer 22, it is thought that a difference in surface roughness between the first region (1*aa*) and the second region (1*ab*) of the surface (1*a*0) of each of the conductor pads (1*a*) is preferably large. The second region (1*ab*) of the surface (1*a*0) can have a surface roughness equal to or less than the first surface roughness of the surfaces (1*b*1) of the wiring patterns (1*b*). For example, the second surface roughness in the second portion (1*a*2) of the first region (1*aa*) of each of the conductor pads (1*a*) is, for example, 100% or more higher than the first surface roughness of the surfaces (1*b*1) of the wiring patterns (1*b*). In this case, it may be possible to prevent a temperature rise in the conductor pads (1*a*) that may cause peeling between the insulating layer 22 and the conductor pads (1*a*) while preventing infiltration of a liquid into the interfaces between the conductor pads (1*a*) and the insulating layer 22. In addition, it may be possible that, in the wiring patterns (1*b*), good transmission characteristics for signals of high frequencies on the order of several GHz are obtained.

The second surface roughness may be 200% or more and 1200% or less of the first surface roughness. In this case, it is thought that a roughening process of the conductor pads (1*a*) does not require an excessive time, and damage to the insulating layer 21 and the like during the roughening process is also small. The first surface roughness is, for example, 0.05 μm or more and 0.15 μm or less in terms of arithmetic mean roughness (Ra). The second surface roughness is, for example, 0.3 μm or more and 0.6 μm or less in terms of arithmetic mean roughness (Ra). That is, the arithmetic mean roughness (Ra) of the second portion (1a2) of the first region (1aa) of each of the conductor pads (1a) is equal to or more than twice the arithmetic mean roughness (Ra) of the surfaces (1b1) of the wiring patterns (1b) or the second region (1ab) of each of the conductor pads (1a).

A size of the second region (1ab) is selected such that a temperature rise in the conductor pads (1a) during the formation of the through holes (4a) can be suppressed. Preferably, for a larger area of each of the through holes (4a) in a plan view, an area of the second region (1ab) is larger. A width (W2) of the second region (1ab) is, for example, 70% or more, preferably 80% or more of a width (W3) of each of the connection conductors 4 (that is, a width of each of the through holes (4a)) at an interface with a conductor pad (1a). When the second region (1ab) has the width (W2) of about this ratio, peeling between the insulating layer 22 and the conductor pads (1a) due to a temperature rise in the conductor pads (1a) during the formation of the through holes (4a) is likely to be suppressed.

The "width" of the second region (1ab) of the surface (1a0) of each of the conductor pads (1a), each of the connection conductors 4, or each of the through holes (4a) is a longest distance between any two points on an outer circumference in a plan view of the second region (1ab), each of the connection conductors 4, or each of the through holes (4a). The second region (1ab), the connection conductors 4, and the through holes (4a) can each have any planar shape. For example, when the second region (1ab) has a circular planar shape, the width of the second region (1ab) is a diameter of the planar shape of the second region (1ab).

In the example of FIG. 4A, the connection conductors 4 each have a tapered shape that is thinner on the first conductor layer 11 side than on the second conductor layer 12 side. When the connection conductors 4 each have a tapered shape as in the example of FIG. 4A, the width (W2) of the second region (1ab) may be, for example, 60% or more of a width (W4) of each of the connection conductors 4 at an interface with the second conductor layer 12, and preferably 70% or more of the width (W4) of each of the connection conductors 4.

The second region (1ab) has the width (W2) that is 70% or more of the width (W3) of each of the connection conductors 4, and, when the insulating layer 22 has a thickness of, for example, about 30 μm-100 μm, the width (bottom width) (W3) of each of the connection conductors 4 that each have a circular planar shape is, for example, 20 μm or more and 90 μm or less. Further, in this case, the width (top width) (W4) of each of the connection conductors 4 is, for example, 30 μm or more and 100 μm or less.

As will be described later, the width (W2) of the second region (1ab) may be larger than the width (W3) of each of the connection conductors 4. That is, the area of the second region (1ab) may be larger than an area of each of the connection conductors 4 (that is, an opening area of each of the through holes (4a)) at an interface with a conductor pad (1a). Even when formation positions of the through holes (4a) vary to some extent, the connection conductors 4 can be formed such that the connection conductors 4 entirely fit within the second regions (1ab) in a plan view. In this case, the width (W2) of the second region (1ab) is, for example, 130% or less, preferably 120% or less of the width (W3) of each of the connection conductors 4 (that is, the width of each of the through holes (4a) at an interface with a conductor pad (1a)). It is thought that the conductor pads (1a) are unlikely to become too large to affect a size of the wiring substrate 100.

Figure 5A:
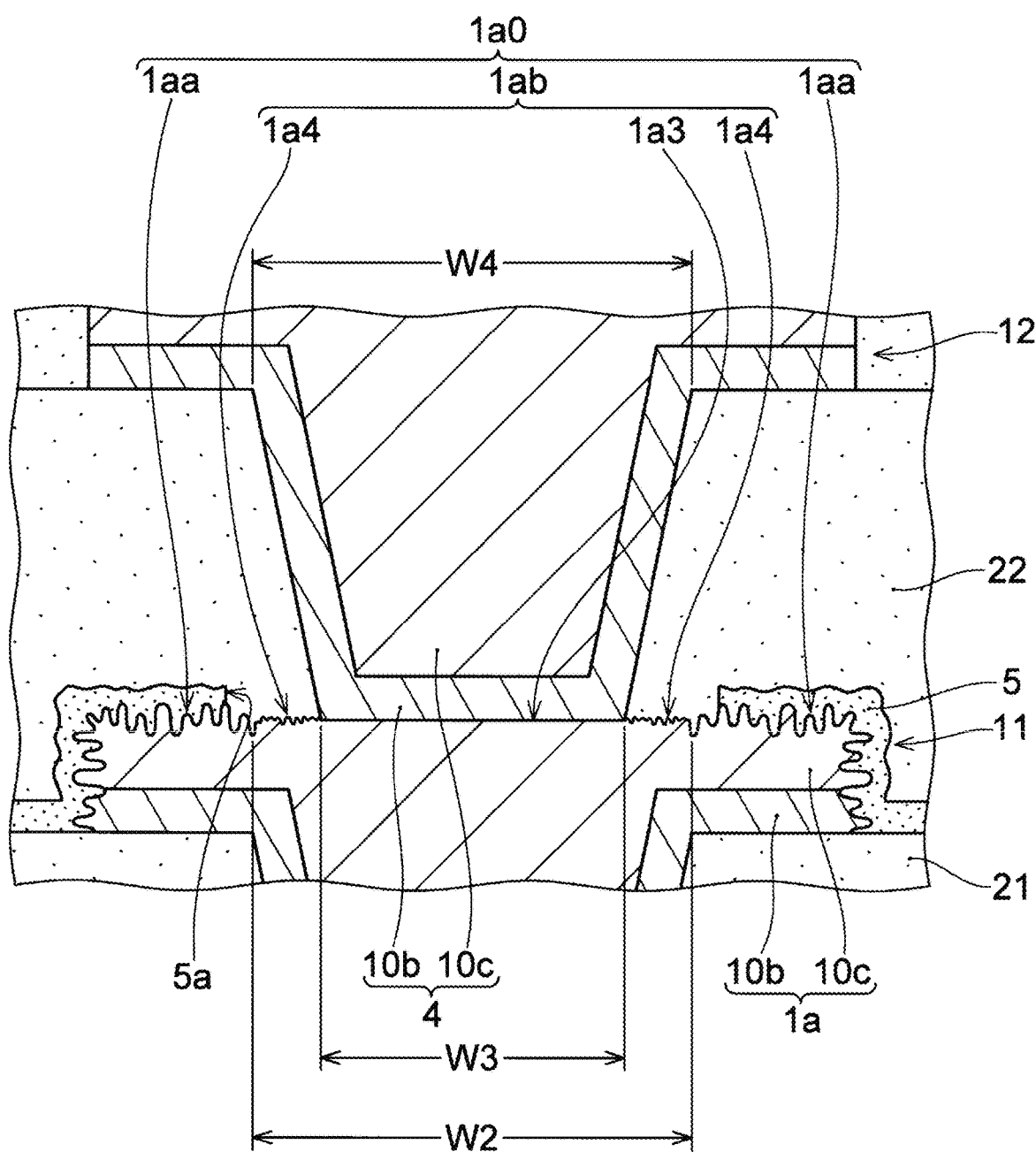
FIG. 5A is a cross-sectional view illustrating another example of surface roughness of a conductor pad according to an embodiment of the present invention.
Figure 5B:
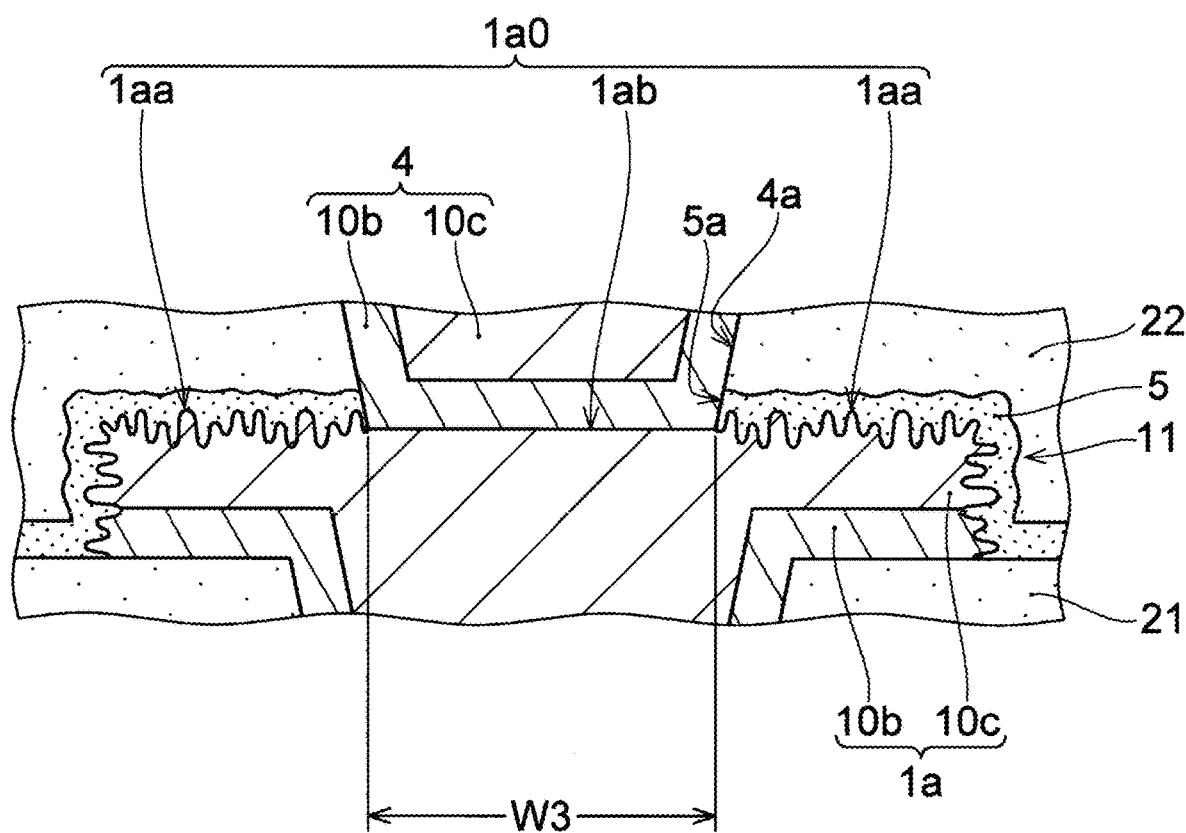
FIG. 5B is a cross-sectional view illustrating yet another example of surface roughness of a conductor pad according to an embodiment of the present invention.

FIGS. 5A and 5B illustrate other examples of the conductor pads (1a) in the wiring substrate of the present embodiment. FIG. 5A is an enlarged view of a portion corresponding to a portion (IVA) of FIG. 1 in another example of the conductor pads (1a). FIG. 5B is an enlarged view of a conductor pad (1a) in yet another example of the conductor pads (1a). In FIGS. 5A and 5B, a structural element that is the same as in the example illustrated in FIG. 1 is indicated using the same reference numeral symbol as the one used in FIG. 4A or is omitted as appropriate, and a repeated description thereof is omitted. FIGS. 5A and 5B each illustrate another example of the conductor pads (1a) regarding the surface roughness of the surface (1a0).

In the example of FIG. 5A, similar to the example of FIG. 4A, the surface (1a0) of each of the conductor pads (1a) has a first region (1aa) and a second region (1ab) that have mutually different surface roughnesses. Also in the example of FIG. 5A, the first region (1aa) has a higher surface roughness than the first surface roughness of the surfaces (1b1) of the wiring patterns (1b) (see FIG. 3), and the second region (1ab) has a surface roughness equal to or less than the first surface roughness. The second region (1ab) is surrounded by the first region (1aa). The first region (1aa) can have, for example, the same second surface roughness as the second portion (1a2) of the first region (1aa) in the example of FIG. 4A.

The coating film 5 covers the first regions (1aa) and side surfaces of the conductor pads (1a). The coating film 5 has an opening (5a) on the first region (1aa) and covers the first region (1aa) with a portion around the opening (5a). The second region (1ab), and a portion of the first region (1aa) near the second region (1ab), are exposed from the opening (5a) of the coating film 5. The portion of the first region (1aa) exposed in the opening (5a) of the coating film 5 and a peripheral edge portion of the second region (1ab) are directly covered by the insulating layer 22. And, an inner portion (center portion) of the second region (1ab) is connected to a connection conductor 4. That is, the connection conductor 4 covers a portion of the second region (1ab) that is not covered by any of the coating film 5 and the insulating layer 22.

The second region (1ab) in the example of FIG. 5A includes a third portion (1a3) having a lower surface roughness than the first surface roughness of the surfaces (1b1) of wiring patterns (1b) (see FIG. 3), and a fourth portion (1a4) having substantially the same surface roughness as the first surface roughness. The fourth portion (1a4) surrounds the third portion (1a3). The third portion (1a3) is not covered by the coating film 5, but is exposed in an opening (5a) and is covered by a connection conductor 4. On the other hand, the fourth portion (1a4) is adjacent to the first region (1aa) and, together with a portion of the first region (1aa), is directly covered by the insulating layer 22 without intervention of the coating film 5. In FIG. 5A, the third portion (1a3) is drawn flat to show a difference in surface roughness from the fourth portion (1a4). However, the third portion (1a3) does not have to be a flat surface and may have an unevenness corresponding to any surface roughness equal to or lower than the first surface roughness.

As in the example of FIG. 5A, the width (W2) of the second region (1ab) of each of the conductor pads (1a) may be larger than the width (W3) of each of the connection conductors 4 at an interface with the each of the conductor pads (1*a*). In other words, an area of the second region (1*ab*) may be larger than an area a connection conductor 4 at an interface with a conductor pad (1*a*), and an interface between the conductor pad (1*a*) and the connection conductor 4 may entirely fit within the second region (1*ab*). For example, as in the example of FIG. 5A, the width (W2) of the second region (1*ab*) may be substantially the same as the width (W4) of each of the connection conductors 4 at an interface with the second conductor layer 12, or may be larger than the width (W4) of each of the connection conductors 4. Since the second region (1*ab*) having a low surface roughness is wide, it is thought that a temperature rise in the conductor pads (1*a*) is likely to be suppressed.

Also in the example of FIG. 5A, unintended infiltration of a liquid into the interfaces between the conductor pads (1*a*) and the insulating layer 22 is prevented by the unevenness of the first regions (1*aa*) having a relatively high surface roughness (for example, the second surface roughness). Further, since a portion of the first region (1*aa*) exists on an inner side of the coating film 5 in the surface (1*a*0), dissolution of the coating film 5 due to infiltration of a liquid is also prevented by the unevenness of the first region (1*aa*).

As in the example in FIG. 5B, the width of the second region (1*ab*) of the surface (1*a*0) of each of the conductor pads (1*a*) may be substantially the same as the width (W3) of each of the connection conductors 4 at an interface with a conductor pad (1*a*). Also in the example of FIG. 5B, the surface (1*a*0) includes a second region (1*ab*) that has a relatively low surface roughness and a first region (1*aa*) that surrounds the second region (1*ab*) and has a relatively high surface roughness. And, the coating film 5 only covers the entire first region (1*aa*) of the surface (1*a*0) and exposes the entire second region (1*ab*) in an opening (5*a*). The connection conductors 4 each connect to a conductor pad (1*a*) in the second region (1*ab*) exposed in an opening (5*a*) and cover the entire second region (1*ab*). The entire second region (1*ab*) has a surface roughness lower than the surface roughness of the surfaces (1*b*1) of the wiring patterns (1*b*) (see FIG. 3). Also in the example of FIG. 5B, a temperature rise in the conductor pads (1*a*) during the formation of the through holes (4*a*) is suppressed, and unintentional infiltration of a liquid into the interfaces between the conductor pads (1*a*) and the insulating layer 22 is prevented by the unevenness of the first regions (1*aa*). That is, the interfacial peeling between the conductor pads (1*a*) and the insulating layer 22 is unlikely to occur.

Figure 6:
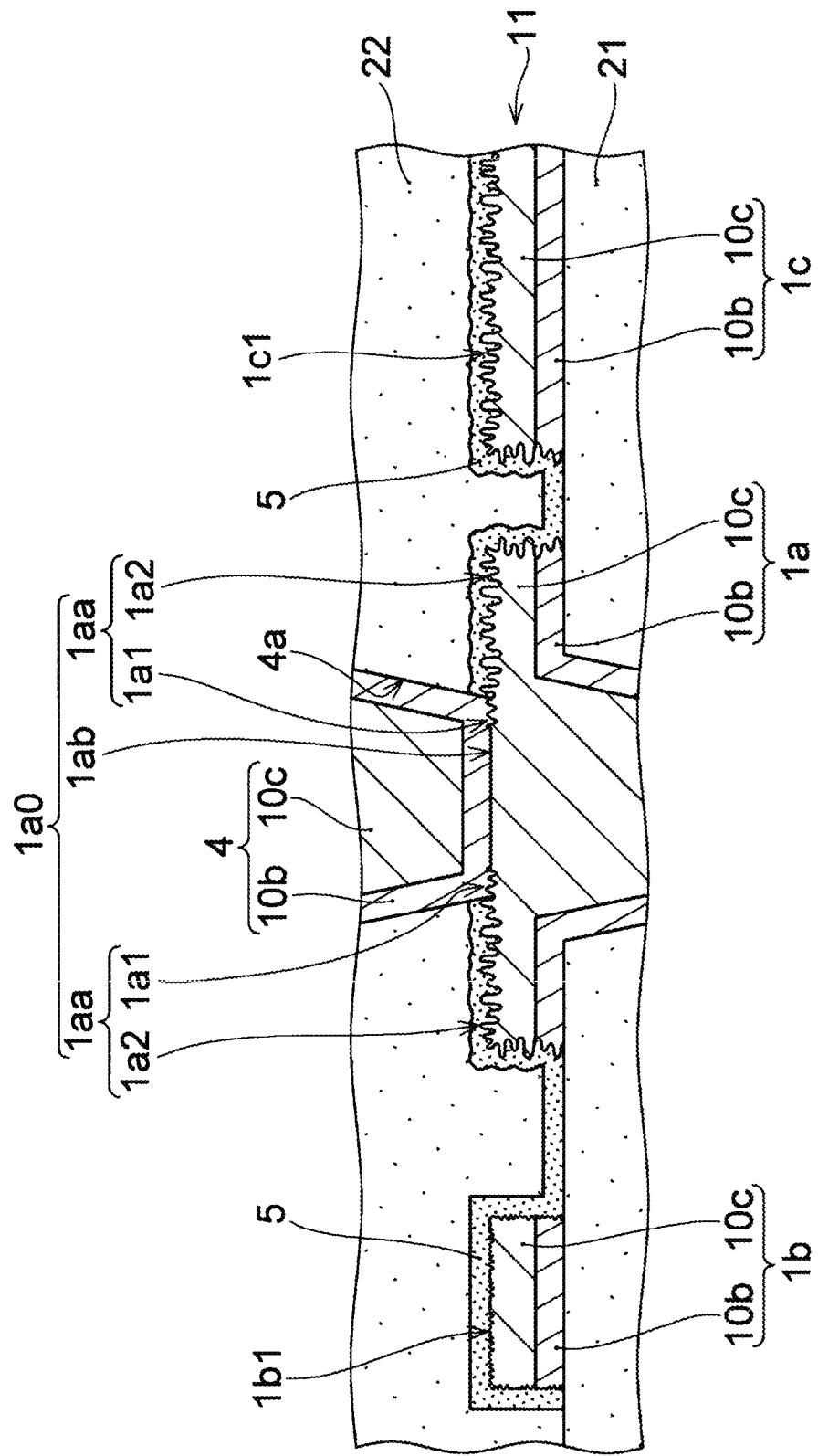
FIG. 6 is a cross-sectional view illustrating another example of a wiring substrate according to an embodiment of the present invention.

FIG. 6 illustrates another example of the wiring substrate of the present embodiment. FIG. 6 is enlarged view of a portion corresponding to the portion (III) of FIG. 1 in the other examples of the wiring substrate of the present embodiment. In FIG. 6, a structural element that is the same as in the example illustrated in FIG. 1 is indicated using the same reference numeral symbol as the one used in FIG. 3 or is omitted as appropriate, and a repeated description thereof is omitted.

In the example of FIG. 6, the surface (1*c*1) of the conductor pattern (1*c*) is also roughened to have a surface roughness (for example, the same second surface roughness as the second portion (1*a*2)) higher than the first surface roughness of the surfaces (1*b*1) of the wiring patterns (1*b*), similar to the second portion (1*a*2) of the surface (1*a*0) of each of the conductor pads (1*a*). The surface (1*c*1) is further covered by the coating film 5. Therefore, it is thought that interfacial separation between the conductor pattern (1*c*) and the insulating layer 22 is more unlikely to occur. In this way, the surface (1*c*1) of the conductor pattern (1*c*) may also be roughened to have, for example, the second surface roughness. The conductor pattern (1*c*) does not have to be covered by the coating film 5.

Next, a method for manufacturing the wiring substrate of the embodiment is described with reference to FIGS. 7A-7H using the wiring substrate 100 of FIG. 1 as an example.

Figure 7A:
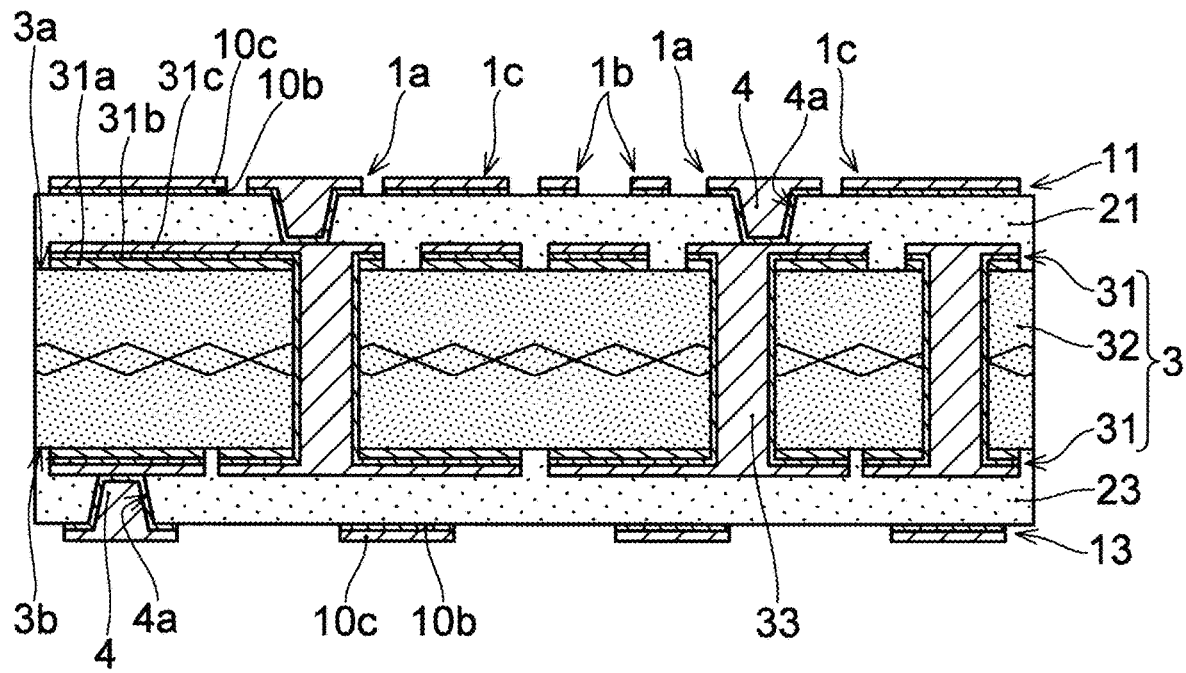
FIG. 7A is a cross-sectional view illustrating an example of a process of a method for manufacturing a wiring substrate according to an embodiment of the present invention.

As illustrated in FIG. 7A, a starting substrate (for example, a double-sided copper-clad laminated plate) that includes an insulating layer, which is to become the insulating layer 32 of the core substrate 3, and the metal foils (31*a*) that are respectively laminated on both sides of the insulating layer is prepared, and the conductor layers 31 and the connection conductors 33 of the core substrate 3 are formed. For example, through holes are formed at formation positions of the connection conductors 33 by drilling or irradiation of $CO_2$ laser, and the metal film (31*b*) is formed in the through holes and on the metal foils (31*a*) by electroless plating or sputtering or the like. Then, the plating film (31*c*) is formed by electrolytic plating using the metal film (31*b*) as a power feeding layer. As a result, the conductor layers 31 having a three-layer structure, and the connection conductors 33 having a two-layer structure, are formed. After that, the core substrate 3 having predetermined conductor patterns is obtained by patterning the conductor layers 31 using a subtractive method.

Then, the insulating layer 21 (first insulating layer) and the insulating layer 23 are respectively formed on the first surface (3*a*) and the second surface (3*b*) of the core substrate 3. In forming each of the insulating layer 21 and the insulating layer 23, for example, a film-like epoxy resin is laminated on the core substrate 3 and is heated and pressed. The insulating layer 21 and the insulating layer 23 can be formed using any resin such as a BT resin or a phenol resin without being limited to using a film-like epoxy resin. In the insulating layer 21 and the insulating layer 23, the through holes (4*a*) for forming the connection conductors 4 are formed by, for example, irradiation of $CO_2$ laser.

The method for manufacturing the wiring substrate of the present embodiment includes, as illustrated in FIG. 7A, forming the first conductor layer 11 having the conductor pads (1*a*) on the insulating layer 21. In the example of FIG. 7A, the first conductor layer 11 further including the wiring patterns (1*b*) and the conductor pattern (1*c*) is formed. The conductor layer 13 is formed on the second surface (3*b*) side of the core substrate 3. The connection conductors 4 are formed in the insulating layer 21 and the insulating layer 23. The first conductor layer 11, the conductor layer 13, and the connection conductors 4 are formed using, for example, a semi-additive method. That is, the metal film (10*b*) is formed in the through holes (4*a*) and on the surfaces of the insulating layer 21 and the insulating layer 23, for example, by electroless plating. A plating resist (not illustrated in the drawings) having openings corresponding to the conductor pads (1*a*), the wiring patterns (1*b*), and the conductor pattern (1*c*), or openings corresponding to conductor patterns to be included in the conductor layer 13 is formed on the metal film (10*b*). Then, the plating film (10*c*) is formed in the openings of the plating resist by electrolytic plating using the metal film (10*b*) as a power feeding layer. As a result, the first conductor layer 11 and the conductor layer 13 are formed. The connection conductors 4 are formed in the through holes (4*a*). After that, the plating resist is removed, for example, using an alkaline peeling agent such as sodium hydroxide, and further, a portion of the metal film (10*b*) that is exposed without being covered by the plating film (10*c*) is removed by etching or the like.

Figure 7B:
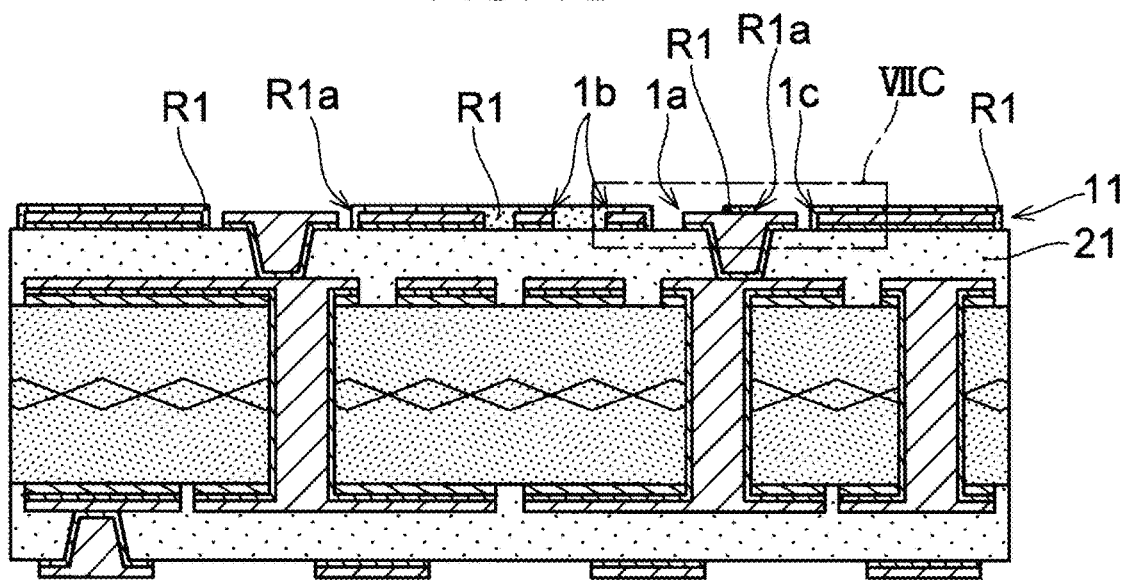
FIG. 7B is a cross-sectional view illustrating an example of a process of a method for manufacturing a wiring substrate according to an embodiment of the present invention.
Figure 7C:
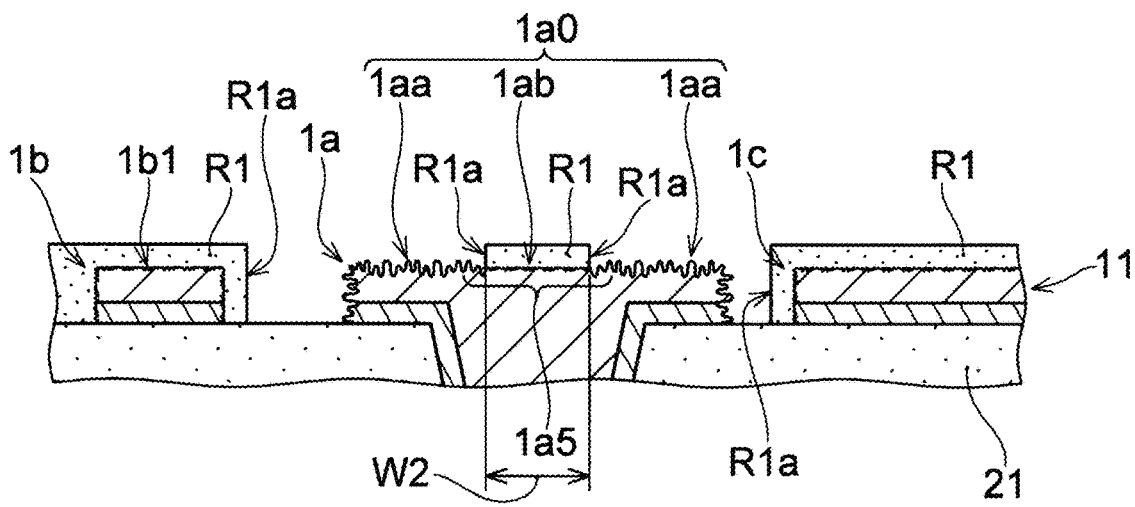
FIG. 7C is a cross-sectional view illustrating an example of a process of a method for manufacturing a wiring substrate according to an embodiment of the present invention.

The method for manufacturing the wiring substrate of the present embodiment includes, as illustrated in FIGS. 7B and 7C, partially roughening an exposed surface, which is a region of the surface of the first conductor layer 11 that is not in contact with the insulating layer 21. FIG. 7C is an enlarged view of an exposed surface of a conductor pad (1a) in a portion (VIIC) of FIG. 7B after the roughening treatment. In the present embodiment, roughening the exposed surfaced of the first conductor layer 11 includes providing the first region (1aa) and the second region (1ab), which have mutually different surface roughnesses, on the surface (1a0) (surface on the opposite side with respect to the insulating layer 21 side) of each of the conductor pads (1a). In the example of FIG. 7C, the roughened first region (1aa) and the unroughened second region (1ab) are provided.

Therefore, the second region (1ab) is provided to have a lower surface roughness than the first region (1aa). In other words, partially roughening the exposed surface of the first conductor layer 11 can include leaving an unroughened non-roughened region (the second region (1ab)) in the surface (1a0) of each of the conductor pads (1a). By providing the first region (1aa) and the second region (1ab), infiltration of various treatment solutions or plating solutions into the interfaces between the conductor pads (1a) and the insulating layer 22 (see FIG. 7E) in subsequent processes and a temperature rise in the conductor pads (1a) are suppressed. As a result, it may be possible that interfacial peeling between the conductor pads (1a) and the insulating layer 22 is prevented.

In the example of FIG. 7C, the exposed surface of the first conductor layer 11 excluding the wiring patterns (1b) is roughened. Since the surfaces (1b1) of the wiring patterns (1b) are not roughened, it is possible to obtain wiring patterns (1b) with excellent high frequency transmission characteristics. Therefore, as illustrated in FIGS. 7B and 7C, in roughening the exposed surface of the first conductor layer 11, a resist film (R1) covering the wiring patterns (1b) and regions to become the second regions (1ab) of the surfaces (1a0) of the conductor pads (1a) is provided. In the wiring substrate 100 of FIG. 1, the surface of the conductor pattern (1c) is also not roughened. Therefore, the resist film (R1) of FIGS. 7B and 7C is provided to also cover the conductor pattern (1c).

The resist film (R1) is formed, for example, by laminating a film containing a photosensitive resin. Openings (R1a) exposing at least regions to become the first regions (1aa) of the conductor pads (1a) are provided in the resist film (R1) using photolithography technologies such as exposure and development. For example, the resist film (R1) is formed of the same material as that of the plating resist (not illustrated in the drawings) used in the formation of the first conductor layer 11 described above. After that, for example, the exposed surface of the first conductor layer 11 is roughened using any method such as a surface oxidation treatment called a blackening treatment or a browning treatment or a micro-etching treatment using an acidic solvent.

The second regions (1ab) of the conductor pads (1a) are provided at the positions where they overlap with the connection conductors 4 (see FIG. 7H) formed in a subsequent process. In the example of FIG. 7C, the second region (1ab) is provided to have a width (W2) smaller than a width of a region (1a5) to be connected to a connection conductor 4 in the surface (1a0) (a width of the connection conductor 4 at an interface with the conductor pad (1a)). That is, the second region (1ab) that has a smaller area than the region (1a5) and is included in the region (1a5) is provided. In the method for manufacturing the wiring substrate of the embodiment, it is also possible that a second region (1ab) having a width equal to or larger than the width of a connection conductor 4 at an interface with a conductor pad (1a) is provided.

The first region (1aa) of each of the conductor pads (1a) can be roughened, for example, to have a higher surface roughness (second surface roughness) than the surface roughness of the second region (1ab) of each of the conductor pads (1a) and the surface roughness (first surface roughness) of the surfaces (1b1) of the wiring patterns (1b). The first region (1aa) of each of the conductor pads (1a) is roughened, for example, to have a surface roughness of 0.3 µm or more and 0.6 µm or less in terms of arithmetic mean roughness (Ra). After the roughening of the exposed surfaces of the conductor pads (1a), the resist film (R1) is removed, for example, using an alkaline peeling agent such as sodium hydroxide.

Figure 7D:
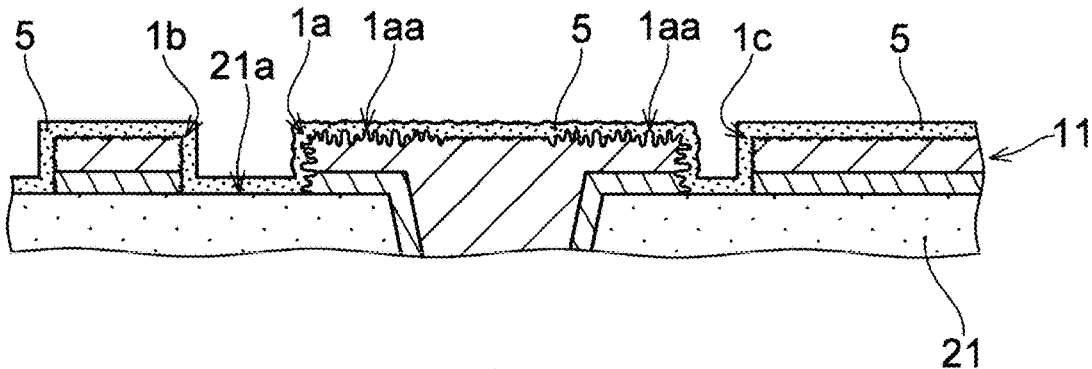
FIG. 7D is a cross-sectional view illustrating an example of a process of a method for manufacturing a wiring substrate according to an embodiment of the present invention.

As illustrated in FIG. 7D, the method for manufacturing the wiring substrate of the present embodiment further includes providing the coating film 5 that covers the first conductor layer 11. FIG. 7D illustrates a state after the formation of the coating film 5 in the same portion as FIG. 7C. Providing the coating film 5 includes covering the first regions (1aa) of the conductor pads (1a) with the coating film 5. In the example of FIG. 7D, the coating film 5 that covers the entire first conductor layer 11 including the conductor pads (1a) and the conductor pattern (1c) and the surface (21a) of the insulating layer 21 is formed. The coating film 5 improves the adhesion between the first conductor layer 11 and the insulating layer 22 (see FIG. 7E) formed in a subsequent process. Also for the conductor pads (1a), adhesion with the insulating layer 22 can be improved. The coating film 5 is formed, for example, by immersion of the first conductor layer 11 and the insulating layer 21 in a liquid containing a material such as a silane coupling agent that can bind to both an organic material and an inorganic material, or by spraying of such a liquid. However, a method for forming the coating film 5 is arbitrary, and is not limited to immersion in a material forming the coating film 5 or spraying of such a material.

Figure 7E:
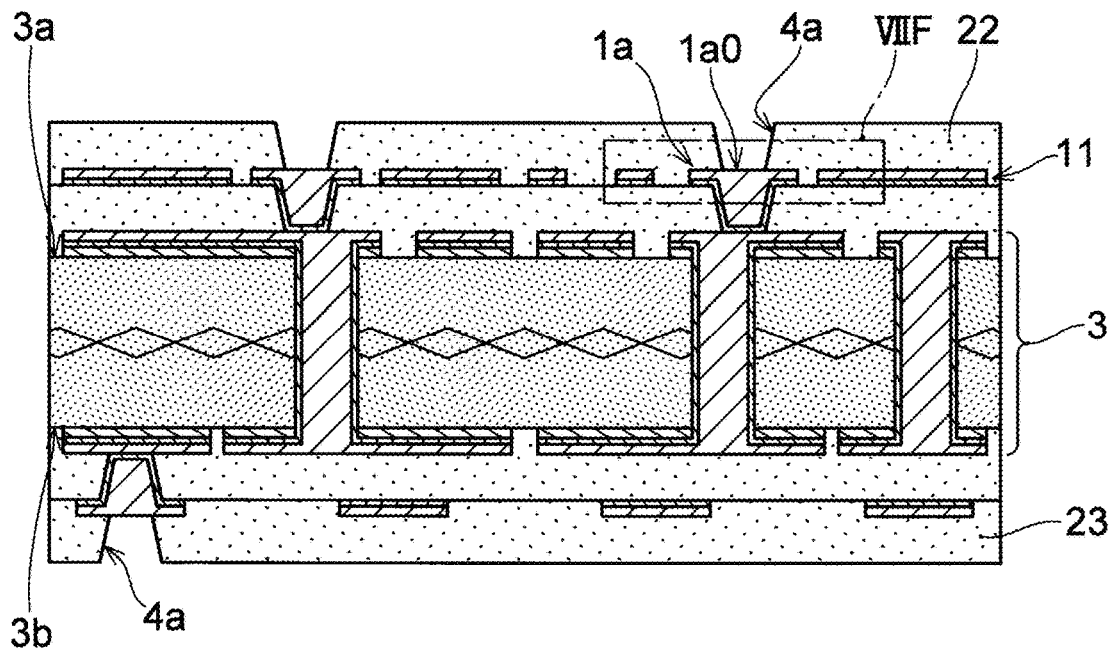
FIG. 7E is a cross-sectional view illustrating an example of a process of a method for manufacturing a wiring substrate according to an embodiment of the present invention.
Figure 7F:
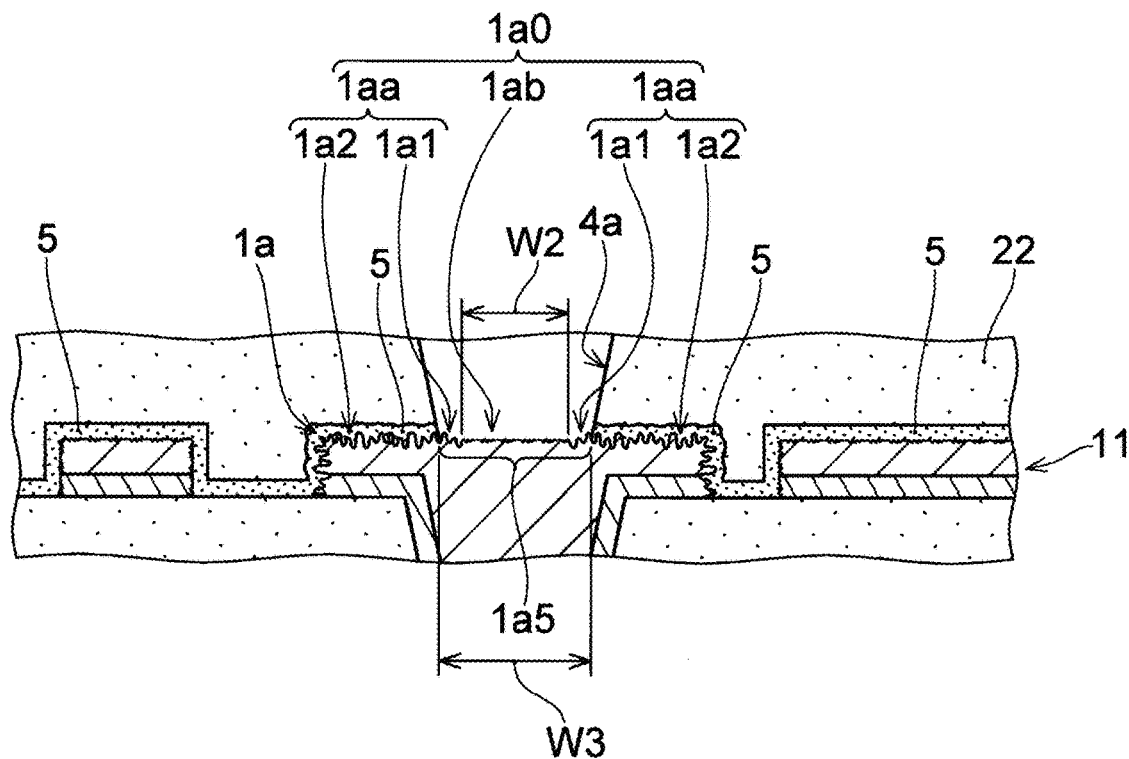
FIG. 7F is a cross-sectional view illustrating an example of a process of a method for manufacturing a wiring substrate according to an embodiment of the present invention.

As illustrated in FIGS. 7E and 7F, the method for manufacturing the wiring substrate of the present embodiment further includes forming the insulating layer 22 (second insulating layer) on the first conductor layer 11 and the coating film 5. FIG. 7F illustrates an enlarged view of a portion (VIIF) of FIG. 7E. By the formation of the insulating layer 22, the entire conductor pads (1a) are temporarily covered by the insulating layer 22. The insulating layer 23 is further formed on the second surface (3b) side of the core substrate 3. Similar to the insulating layer 21, the insulating layer 22 and the insulating layer 23 are each formed, for example, by laminating a film-like epoxy resin and applying heat and pressure thereto.

In the insulating layer 22 and the insulating layer 23, the through holes (4a) for forming the connection conductors 4 (see FIG. 7G) in a subsequent process are formed, for example, by irradiation of laser such as $CO_2$ laser. The through holes (4a) are formed in the insulating layer 22 on the regions (1a5) (regions to be connected to the connection conductors 4) of the conductor pads (1a). By the formation of the through holes (4a), the second regions (1ab) (non-roughened regions) are exposed in the through holes (4a). In this way, forming the connection conductors 4 in a subsequent process may include forming in the insulating layer 22 the through holes (4a) that expose the second regions (1ab).

As in the example of FIG. 7F, when the conductor pads (1a) are covered by the coating film 5, for example, by irradiating laser to form the through holes (4a), portions of the coating film 5 irradiated with laser are removed by vaporization, sublimation, or the like. Specifically, portions of the coating film 5 that cover the regions (1a5) of the conductor pads (1a) are removed. The regions (1a5) of the conductor pads (1a) at least partially overlap with the second regions (1ab) (non-roughened regions). Therefore, forming the through holes (4a) can include removing the portions of the coating film 5 that cover the second regions (1ab).

In the present embodiment, since the second regions (1ab) (non-roughened regions) are provided in the surfaces (1a0) of the conductor pads (1a) to which laser is irradiated when the through holes (4a) are formed, an amount of heat absorbed from laser in the conductor pads (1a) can be reduced. As described above, interfacial peeling between the conductor pads (1a) and the insulating layer 22 is suppressed. On the other hand, when the surfaces (1a0) of the conductor pads (1a) irradiated with laser are covered by the coating film 5, a solution of the coating film 5 generated by the laser irradiation may infiltrate into the interfaces between the conductor pads (1a) and the insulating layer 22 and cause interfacial peeling. However, according to the present embodiment, due to the roughening process, the first region (1aa) having a relatively high surface roughness is provided in the surface (1a0) of each of the conductor pads (1a). Therefore, such infiltration of the solution is prevented.

The through holes (4a) are formed such that the width (W2) of the second region (1ab) is, for example, 70% or more and 130% or less, preferably 80% or more and 120% or less of the opening width (W3) of each of the through holes (4a) on the conductor pads (1a) side (that is, the width of each of the connection conductors 4 to be formed in a subsequent process). In this way, when the through holes (4a) are formed, it is thought that interfacial peeling between the insulating layer 22 and the conductor pads (1a) due to a temperature rise in the conductor pads (1a) is suppressed. Further, it is thought that the conductor pads (1a) are unlikely to become too large to affect the size of the wiring substrate.

In the example of FIG. 7F, each of the through holes (4a) having an opening width larger than the width (W2) of the second region (1ab) are formed. Therefore, the entire second regions (1ab) are exposed in the through holes (4a). Further, a portion (the first portion (1a1)) of the first region (1aa) of the surface (1a0) of each of the conductor pads (1a) near an inner wall of a through hole (4a is exposed along the inner wall of the through hole (4a). On the other hand, in the first region (1aa), a portion (the second portion (1a2)) on an outer peripheral side of the first portion (1a1) surrounds the first portion (1a1) and the through hole (4a). On the other hand, the second portions (1a2) are covered by the coating film 5 and the insulating layer 22.

After the formation of the through holes (4a), preferably, a desmear treatment is performed in which resin residues (smears) generated by the formation of the through holes (4a) are removed. For example, the smears in the through holes (4a) are removed by exposing inner walls of the through holes (4a) to a treatment liquid such as an alkaline permanganate solution. Infiltration of a processing liquid for the desmear treatment into the interfaces between the conductor pads (1a) and the insulating layer 22 is prevented by the unevenness of the roughened first regions (1aa), especially the second portions (1a2), of the conductor pads (1a). Further, in the formation of through holes (4a), when interfacial peeling between the insulating layer 22 and the conductor pads (1a) occurs, the interfacial peeling may expand due to the desmear treatment. However, in the present embodiment, as described above, a temperature rise in the conductor pads (1a) during the formation of the through holes (4a) is suppressed. Therefore, occurrence or expansion of the interfacial peeling due to the desmear treatment is unlikely to occur.

Figure 7G:
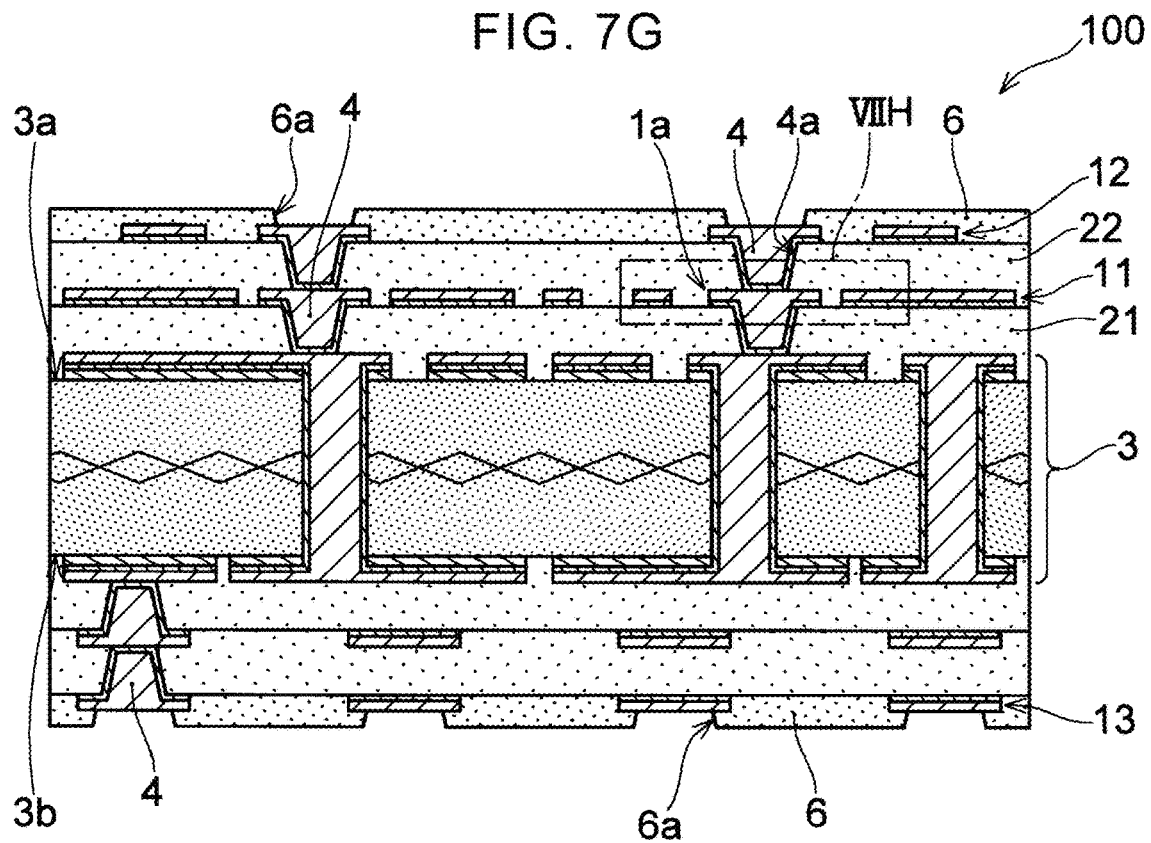
FIG. 7G is a cross-sectional view illustrating an example of a process of a method for manufacturing a wiring substrate according to an embodiment of the present invention.
Figure 7H:
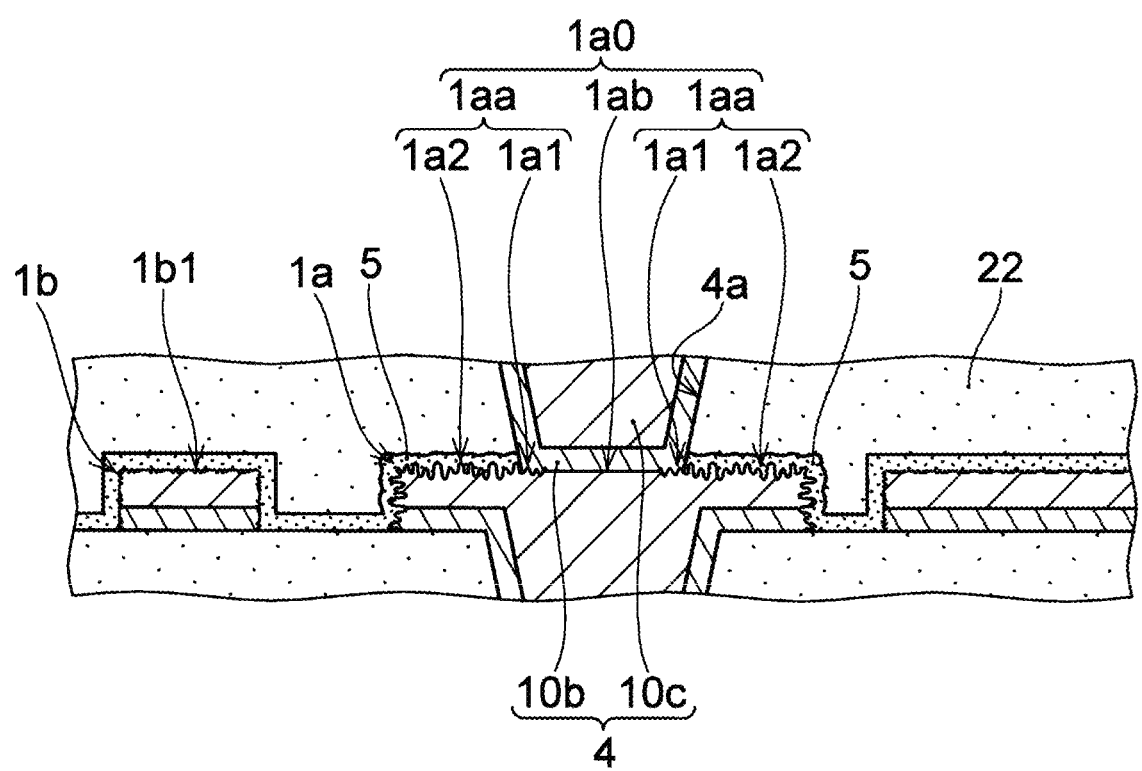
FIG. 7H is a cross-sectional view illustrating an example of a process of a method for manufacturing a wiring substrate according to an embodiment of the present invention.

As illustrated in FIGS. 7G and 7H, the method for manufacturing the wiring substrate of the present embodiment further includes: forming the second conductor layer 12 on the insulating layer 22; and forming the connection conductors 4 that penetrate the insulating layer 22 and connect the conductor pads (1a) and the second conductor layer 12. On the second surface (3b) side of the core substrate 3, the conductor layer 13 and the connection conductors 4 are further formed. FIG. 7H illustrates an enlarged view of a portion (VIIH) of FIG. 7G.

In the formation of the second conductor layer 12 and the connection conductors 4, a soft etching process is preferably performed. By the soft etching process, an oxide film on the surfaces (the surface of the insulating layer 22 and the surfaces (1a0) of the conductor pads (1a) exposed in the through holes (4a)) on which the second conductor layer 12 and the connection conductors 4 are formed is removed. Also, by the soft etching process, the surface roughness of the second region (1ab) of the surface (1a0) of each of the conductor pads (1a) and the surface roughness of the first portion (1a1) of the first region (1aa) exposed in each of the through holes (4a) can be reduced. For example, when the wiring substrate 100 illustrated in FIG. 1 is manufactured, by the soft etching process, the second region (1ab) may be flattened to have a lower surface roughness than the surface roughness (first surface roughness) of the surfaces (1b1) of the wiring patterns (1b). Further, the first portion (1a1) of the first region (1aa) may be flattened to have a lower surface roughness than the surface roughness (second surface roughness) of the second portion (1a2).

The soft etching process in the formation of the second conductor layer 12 and the connection conductors 4 may be performed to an extent that the surface roughness of the portions of the surfaces (1a0) of the conductor pads (1a) exposed in the through holes (4a) is substantially not reduced. In this case, the second region (1ab) of each of the conductor pads (1a) can have substantially the same surface roughness (first surface roughness) as the surfaces (1b1) of the wiring patterns (1b). Further, the first portion (1a1) of the first region can have substantially the same surface roughness (second surface roughness) as the second portion (1a2).

The second conductor layer 12 and the connection conductors 4 that penetrate the insulating layer 22 are respectively formed, for example, using the same methods as the above-described methods for forming the first conductor layer 11 and the connection conductors 4 that penetrate the insulating layer 21. For example, the second conductor layer 12 and the connection conductors 4 that penetrate the insulating layer 22, and the conductor layer 13 and the connection conductors 4 that are further formed on the second surface (3b) side of the core substrate 3, are formed using a semi-additive method. The connection conductors 4 that penetrate the insulating layer 22 are formed in the through holes (4a). As a result, the connection conductors 4 that at least partially cover the second regions (1ab) (non-roughened regions) of the conductor pads (1a) are formed. In the example of FIG. 7H, the connection conductors 4 are formed so as to cover the entire second regions (1ab). In this way, in the present embodiment, the connection conductors 4 may be formed so as to cover the entire second regions (1ab) of the surfaces (1a0) of the conductor pads (1a).

In the formation of the connection conductors 4 in the insulating layer 22 using a semi-additive method, as illustrated in FIG. 7H, in the through holes (4a), for example, the metal film (10b) is formed by electroless plating and the plating film (10c) is formed by electrolytic plating. In the method for manufacturing the wiring substrate of the present embodiment, infiltration of a plating solution into the interfaces between the conductor pads (1a) and the insulating layer 22 during the formation of the metal film (10b) is prevented by the unevenness of the roughened first regions (1aa) of the surfaces (1a0) of the conductor pads (1a). It is thought that a defect such as interfacial peeling between the conductor pads (1a) and the insulating layer 22 due to infiltration of a plating solution is prevented.

In the example of FIGS. 7G and 7H in which the wiring substrate 100 of FIG. 1 is manufactured, as illustrated in FIG. 7G, the solder resists 6 are formed. The solder resists 6 are provided with the openings (6a), and each of the openings (6a) exposes a part of the second conductor layer 12 or a part of the conductor layer 13. The solder resists 6 and the openings (6a) are formed, for example, by forming a resin layer containing a photosensitive epoxy resin or polyimide resin or the like and performing exposure and development using a mask having appropriate opening patterns.

Through the above processes, the wiring substrate 100 in the example of FIG. 1 is completed. A surface protective film (not illustrated in the drawings) may be formed on a surface of a part of the second conductor layer 12 or the conductor layer 13 exposed in the openings (6a) of the solder resists 6 by electroless plating, solder leveling, spray coating, or the like.

When the conductor pads (1a) in the example of FIG. 5A referenced above are formed, in the process illustrated in FIG. 7C, the resist film (R1) is formed that covers the entire regions (1a5) of the surfaces (1a0) of the conductor pads (1a) to be connected to the connection conductors 4 and covers portions around the regions (1a5). That is, the resist film (R1) is formed having shielding parts larger than the regions (1a5) of the surfaces (1a0) of the conductor pads (1a) at positions corresponding to the regions (1a5).

Then, in the process illustrated in FIG. 7D, the coating film 5 is formed in a state in which the regions (1a5) are masked by shielding parts that are even larger than the shielding parts that are larger than the regions (1a5). As a result, the conductor pads (1a) are not entirely, but partially covered by the coating film 5 having the openings (5a). In this way, in the method for manufacturing the wiring substrate of the present embodiment, forming the coating film 5 can include partially covering the conductor pads (1a) with the coating film 5. It is also possible that, similar to the example of FIG. 7D, after the coating film 5 covering the entire conductor pads (1a) is formed, and before the insulating layer 22 is formed, the coating film 5 on the conductor pads (1a) is partially removed, for example, by laser irradiation or a plasma treatment. As a result, the openings (5a) of the coating film 5 may be formed.

Further, when the conductor pads (1a) in the example of FIG. 5B are formed, in the process illustrated in FIG. 7C, a resist film (R1) is formed that has shielding parts of substantially the same size as the regions (1a5) of the surfaces (1a0) of the conductor pads (1a) at positions right above the regions (1a5). Also in the case where the conductor pads (1a) in the examples of FIGS. 5A and 5B are formed, in the formation of the connection conductors 4 that penetrate the insulating layer 22, soft etching may be perform to an extent that the surface roughness of the exposed surfaces of the conductor pads (1a) is substantially not reduced. In that case, the entire second region (1ab) can have substantially the same surface roughness (first surface roughness) as the surfaces (1b1) of the wiring patterns (1b).

Further, when the wiring substrate of the example of FIG. 6 referenced above is manufactured, in the process illustrated in FIG. 7C, the exposed surface of the first conductor layer 11 is roughened without providing the resist film (R1) that covers the conductor pattern (1c). Then, similar to the process illustrated in FIG. 7D, the coating film 5 is formed on the entire first conductor layer 11 and on the exposed surface of the insulating layer 21.

The wiring substrate of the embodiment is not limited to those having the structures illustrated in the drawings and those having the structures, shapes, and materials exemplified herein. As described above, the wiring substrate of the embodiment can have any laminated structure. For example, the wiring substrate of the embodiment may be a coreless substrate that does not include a core substrate. The wiring substrate of the embodiment can include any number of conductor layers and any number of insulating layers. The first conductor layer 11 can exist at any layer in a laminated structure of the wiring substrate. All or some of the multiple conductor layers included in the wiring substrate may include conductor pads (1a), wiring patterns (1b), and a conductor pattern (1c) as those included in the first conductor layer 11. The conductor pads (1a) do not have to be via pads of connection conductors that penetrate an insulating layer (the insulating layer 21 in the wiring substrate 100) below the first conductor layer 11. Further, the connection conductors 4 do not have to each have a tapered shape as in the example of FIG. 1 or the like.

The method for manufacturing a wiring substrate of the embodiment is not limited the method described with reference to the drawings. For example, the first and second conductor layers (11, 12) may be formed using a full additive method. The first and second insulating layers (21, 22) can be formed using a resin in any form without being limited to a film-like resin. The soft etching process in the formation of the second conductor layer 12 and the connection conductors 4 does not have to be performed. Further, it is also possible that the connection conductors are not formed in the insulating layers other than the insulating layer 22. In the method for manufacturing the wiring substrate of the embodiment, it is also possible that any process other than the processes described above is added, or some of the processes described above are omitted.

In a printed wiring board according to the method described in Japanese Patent Application Laid-Open Publication No. 2018-172759, interface peeling may occur between a metal wiring layer and a resin insulating layer due to a stress that may be generated during manufacture or use of the printed wiring board. As a result, deterioration in quality of the printed wiring board may occur.

A wiring substrate according to an embodiment of the present invention includes: a first conductor layer; an insulating layer formed on the first conductor layer; a second conductor layer formed on the insulating layer; a connection conductor that penetrates the insulating layer and connects the first conductor layer and the second conductor layer to each other; and a coating film that is formed on a surface of the first conductor layer and improves adhesion between the first conductor layer and the insulating layer. The first conductor layer includes a conductor pad in contact with the connection conductor. A surface of the conductor pad on the second conductor layer side includes a first region and a second region that have mutually different surface roughnesses. The first region is covered by the coating film. The second region is covered by the connection conductor.

A method for manufacturing a wiring substrate according to an embodiment of the present invention includes: forming a first conductor layer having a conductor pad on a first insulating layer; roughening an exposed surface of the first conductor layer; providing a coating film that covers the first conductor layer; forming a second insulating layer on the first conductor layer and the coating film; forming a second conductor layer on the second insulating layer; and forming a connection conductor that penetrates the second insulating layer and connects the conductor pad and the second conductor layer to each other. The roughing of the exposed surface of the first conductor layer includes providing a first region and a second region that have mutually different surface roughnesses on a surface of the conductor pad on the opposite side with respect to the first insulating layer side. The providing of the coating film includes covering the first region with the coating film. The forming of the connection conductor includes covering the second region with the connection conductor.

According to an embodiment of the present invention, desired characteristics of the wiring patterns and adhesion between the wiring patterns and the insulating layer are ensured, and in addition, deterioration in quality of the wiring substrate due to interfacial peeling between the conductor pad, which is in contact with the connection conductor that connect the conductor layers, and the insulating layer is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a first conductor layer;
   an insulating layer formed on the first conductor layer;
   a second conductor layer formed on the insulating layer;
   a connection conductor penetrating through the insulating layer such that the connection conductor is connecting the first conductor layer and the second conductor layer; and
   a coating film formed on a surface of the first conductor layer such that the coating film is adhering the first conductor layer and the insulating layer,
   wherein the first conductor layer includes a conductor pad in contact with the connection conductor such that the conductor pad has a surface having a first region and a second region on a second conductor layer side and that a surface roughness of the first region is different from a surface roughness of the second region, and the first conductor layer is formed such that the first region of the conductor pad is covered by the coating film and that the second region of the conductor pad is covered by the connection conductor.

2. The wiring substrate according to claim 1, wherein the conductor pad of the first conductor layer is formed such that the second region is surrounded by the first region.

3. The wiring substrate according to claim 1, wherein the conductor pad of the first conductor layer is formed such that a width of the second region is in a range of 70% to 130% of a width of the connection conductor at an interface with the conductor pad.

4. The wiring substrate according to claim 1, wherein the coating film is exposing the second region of the conductor pad entirely.

5. The wiring substrate according to claim 4, wherein the connection conductor is covering the second region of the conductor pad entirely.

6. The wiring substrate according to claim 1, wherein the conductor pad of the first conductor layer is formed such that the surface roughness of the second region is lower than the surface roughness of the first region.

7. The wiring substrate according to claim 6, wherein the conductor pad of the first conductor layer is formed such that the first region includes a first portion adjacent to the second region and a second portion surrounding the first portion and having a surface roughness higher than a surface roughness of the first portion.

8. The wiring substrate according to claim 7, wherein the connection conductor is covering the second region entirely and the first portion of the first region entirely.

9. The wiring substrate according to claim 6, wherein the first conductor layer further includes a wiring pattern covered by the coating film such that a surface of the wiring pattern has a first surface roughness lower than the surface roughness of the first region.

10. The wiring substrate according to claim 9, wherein the conductor pad of the first conductor layer is formed such that the second region includes a third portion having a surface roughness lower than the first surface roughness of the wiring pattern.

11. The wiring substrate according to claim 9, wherein the conductor pad of the first conductor layer is formed such that the second region includes a fourth portion having substantially a same surface roughness as the first surface roughness of the wiring pattern.

12. The wiring substrate according to claim 9, wherein the conductor pad of the first conductor layer is formed such that the second region includes a third portion having a surface roughness lower than the first surface roughness of the wiring pattern and a fourth portion surrounding the third portion and having substantially a same surface roughness as the first surface roughness of the wiring pattern.

13. The wiring substrate according to claim 2, wherein the conductor pad of the first conductor layer is formed such that a width of the second region is in a range of 70% to 130% of a width of the connection conductor at an interface with the conductor pad.

14. The wiring substrate according to claim 2, wherein the coating film is exposing the second region of the conductor pad entirely.

15. A method for manufacturing a wiring substrate, comprising:
   forming a first conductor layer having a conductor pad on a first insulating layer;
   roughening an exposed surface of the first conductor layer formed on the first insulating layer;
   forming a coating film on the first conductor layer such that the coating film covers the first conductor layer;
   forming a second insulating layer on the first conductor layer and the coating film formed on the first conductor layer;
   forming a second conductor layer on the second insulating layer; and
   forming a connection conductor in the second insulating layer such that the connection conductor penetrates through the second insulating layer and connects the conductor pad and the second conductor layer,
   wherein the roughing of the exposed surface of the first conductor layer includes forming a surface of the conductor pad having a first region and a second region on an opposite side with respect to a first insulating layer side such that a surface roughness of the first region is different from a surface roughness of the second region, the forming of the coating film includes covering the first region with the coating film, and the forming of the connection conductor includes covering the second region with the connection conductor.

16. The method for manufacturing a wiring substrate according to claim 15, wherein the surface of the conductor pad is formed such that the surface roughness of the second region is lower than the surface roughness of the first region.

17. The method for manufacturing a wiring substrate according to claim 15, wherein the forming of the connection conductor includes forming, in the second insulating layer, a through hole exposing the second region of the conductor pad such that a width of the second region is in a range of 70% to 130% of an opening width of the through hole on a conductor pad side.

18. The method for manufacturing a wiring substrate according to claim 17, wherein the forming of the through hole includes removing a portion of the coating film covering the second region of the conductor pad.

19. The method for manufacturing a wiring substrate according to claim 17, wherein the forming of the through hole includes exposing the second region of the conductor pad in the through hole entirely.

20. The method for manufacturing a wiring substrate according to claim 15, wherein the connection conductor is formed such that the connection conductor covers the second region of the conductor pad entirely.

* * * * *